United States Patent
Chen et al.

(10) Patent No.: US 10,504,751 B2
(45) Date of Patent: Dec. 10, 2019

(54) PACKAGE STRUCTURES AND METHOD OF FORMING THE SAME

(71) Applicant: Taiwan Semiconductor Manufacturing Company, Ltd., Hsinchu (TW)

(72) Inventors: Hsien-Wei Chen, Hsinchu (TW); Cheng-Hsien Hsieh, Kaohsiung (TW); Li-Han Hsu, Hsinchu (TW); Lai Wei Chih, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/041,904

(22) Filed: Jul. 23, 2018

(65) Prior Publication Data

US 2018/0330969 A1    Nov. 15, 2018

Related U.S. Application Data

(62) Division of application No. 14/688,437, filed on Apr. 16, 2015, now Pat. No. 10,032,651.

(Continued)

(51) Int. Cl.
*H01L 21/56* (2006.01)
*H01L 21/78* (2006.01)
(Continued)

(52) U.S. Cl.
CPC .......... *H01L 21/561* (2013.01); *H01L 21/568* (2013.01); *H01L 21/78* (2013.01);
(Continued)

(58) Field of Classification Search
None
See application file for complete search history.

(56) References Cited

U.S. PATENT DOCUMENTS

| 5,024,970 A | 6/1991 | Mori |
| 5,157,001 A | 10/1992 | Sakuma |

(Continued)

FOREIGN PATENT DOCUMENTS

| TW | 200950038 A | 12/2009 |
| TW | 201324700 A | 6/2013 |

(Continued)

*Primary Examiner* — Robert K Carpenter
(74) *Attorney, Agent, or Firm* — Slater Matsil, LLP

(57) ABSTRACT

Package structures and methods of forming package structures are described. A method includes depositing and patterning a first dielectric material. The first dielectric material is deposited in first and second package component regions and in a scribe line region. The scribe line region is disposed between the first and second package component regions. The patterning the first dielectric material forms a first dielectric layer in each of the first and second package component regions and a dummy block in the scribe line region. The dummy block is separated from the first dielectric layer in each of the first and second package component regions. The method further includes forming a metallization pattern on the first dielectric layer; depositing a second dielectric material on the first dielectric layer and the metallization pattern; and patterning the second dielectric material to form a second dielectric layer.

20 Claims, 29 Drawing Sheets

Related U.S. Application Data

(60) Provisional application No. 62/115,573, filed on Feb. 12, 2015.

(51) Int. Cl.
    *H01L 23/31*     (2006.01)
    *H01L 23/00*     (2006.01)
    *H01L 25/10*     (2006.01)
    *H01L 25/00*     (2006.01)
    *H01L 23/498*     (2006.01)
    *H01L 23/538*     (2006.01)
    *H01L 25/065*     (2006.01)

(52) U.S. Cl.
    CPC .... *H01L 23/3185* (2013.01); *H01L 23/49816* (2013.01); *H01L 23/49822* (2013.01); *H01L 23/49827* (2013.01); *H01L 23/5389* (2013.01); *H01L 24/19* (2013.01); *H01L 24/20* (2013.01); *H01L 24/97* (2013.01); *H01L 25/105* (2013.01); *H01L 25/50* (2013.01); *H01L 23/3128* (2013.01); *H01L 24/48* (2013.01); *H01L 25/0657* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83* (2013.01); *H01L 2224/83005* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/00014* (2013.01); *H01L 2924/00015* (2013.01); *H01L 2924/1511* (2013.01); *H01L 2924/15311* (2013.01); *H01L 2924/15321* (2013.01); *H01L 2924/181* (2013.01); *H01L 2924/2064* (2013.01); *H01L 2924/20641* (2013.01)

(56) References Cited

U.S. PATENT DOCUMENTS

| | | |
|---|---|---|
| 7,955,955 B2 | 6/2011 | Lane et al. |
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 10,032,651 B2 * | 7/2018 | Chen ............... H01L 23/49816 |
| 2006/0278957 A1 | 12/2006 | Lin et al. |
| 2010/0273312 A1 | 10/2010 | Noda |
| 2011/0291288 A1 | 12/2011 | Wu et al. |
| 2013/0026468 A1 | 1/2013 | Yoshimuta et al. |
| 2013/0032938 A1 | 2/2013 | Lin et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0151890 A1 | 6/2014 | Mao et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0263582 A1 | 9/2014 | Uzoh |
| 2014/0264930 A1 | 9/2014 | Yu et al. |

FOREIGN PATENT DOCUMENTS

| | | |
|---|---|---|
| TW | 201347627 A | 11/2013 |
| TW | 201421635 A | 6/2014 |
| TW | 201445654 A | 12/2014 |

* cited by examiner

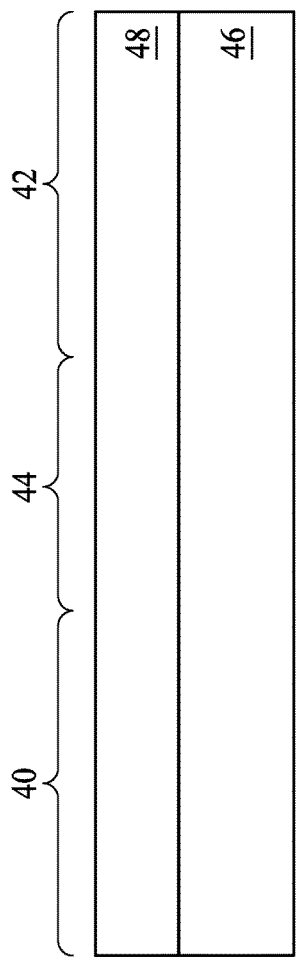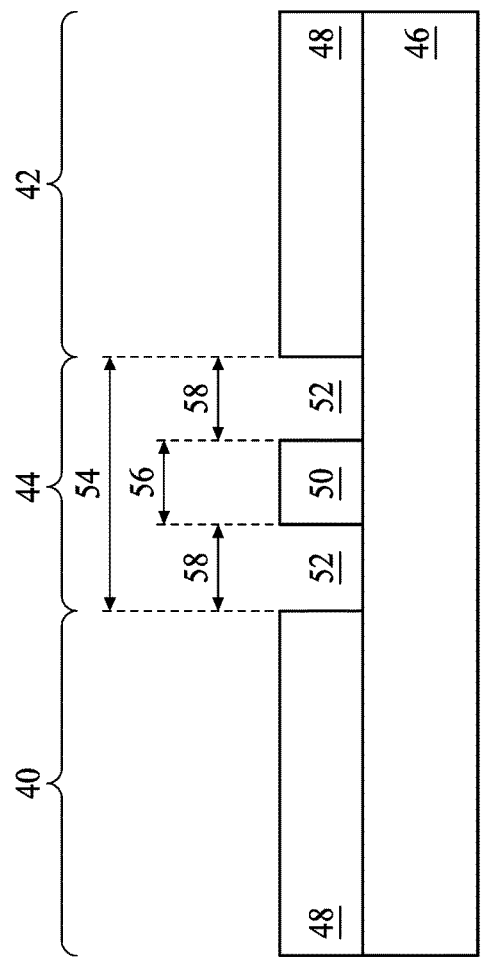

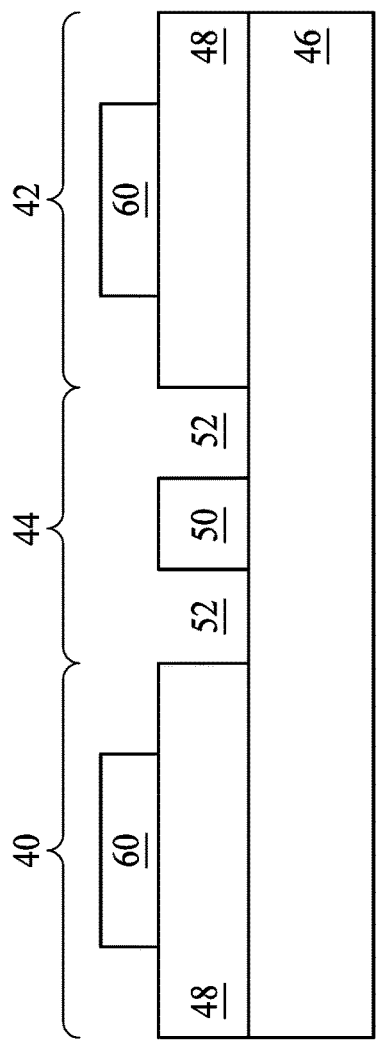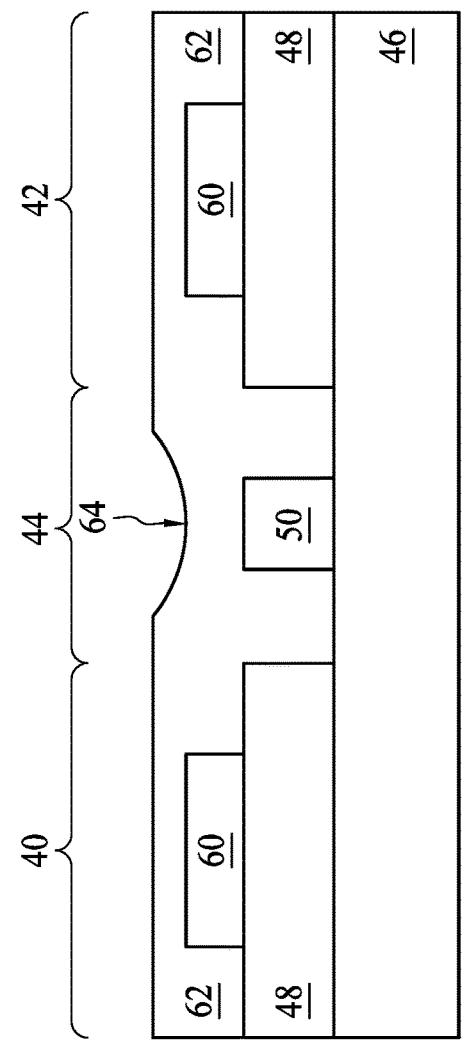

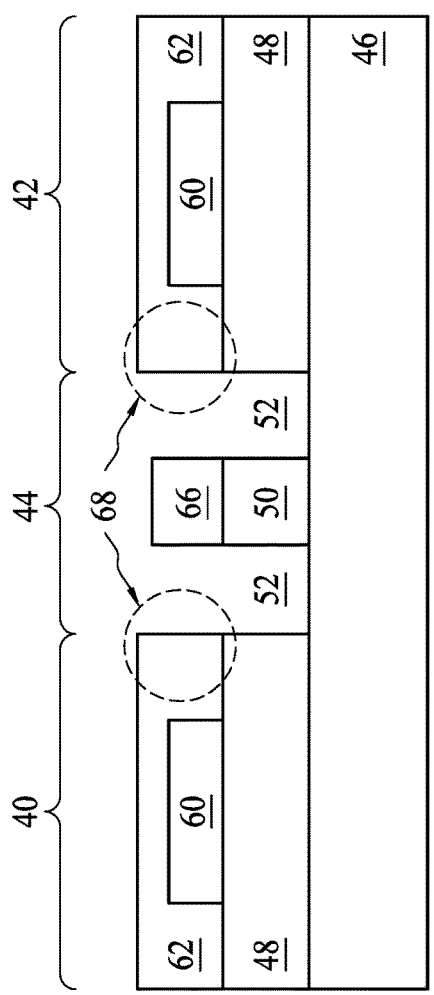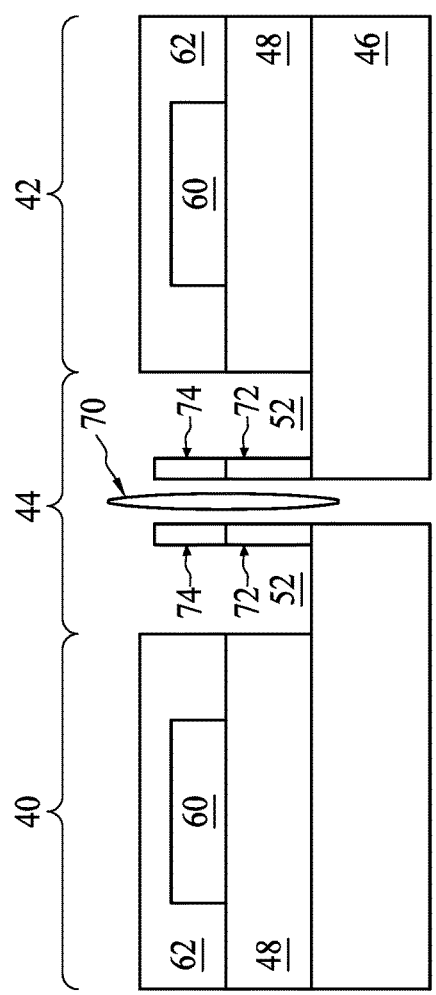
Fig. 5
Fig. 6

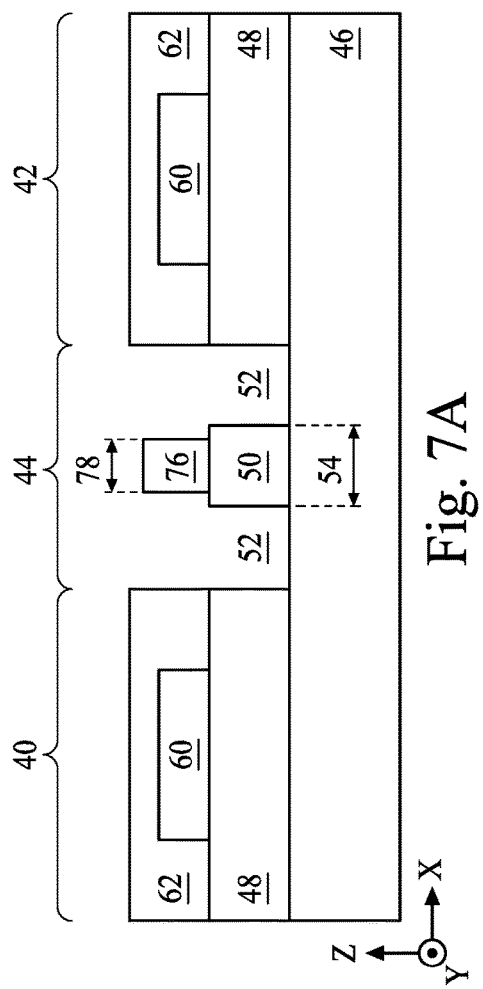
Fig. 7A
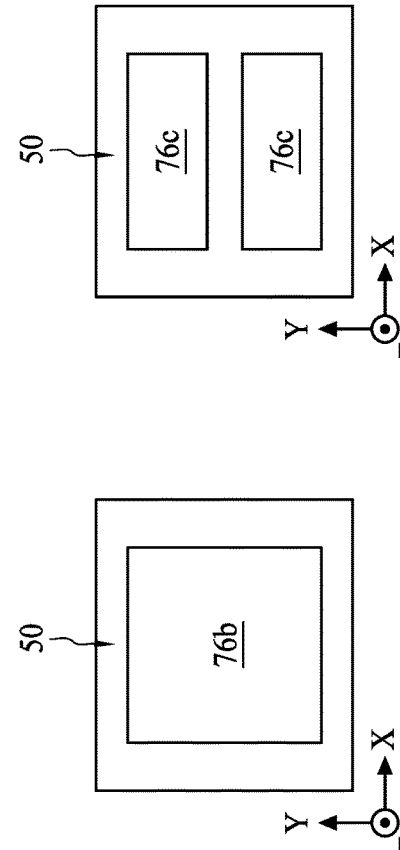
Fig. 7D
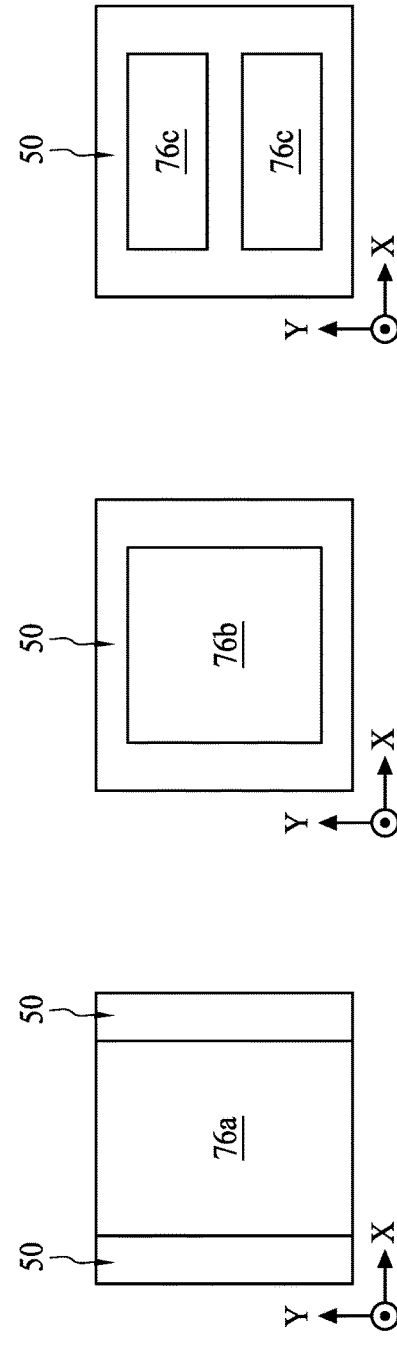
Fig. 7C
Fig. 7B

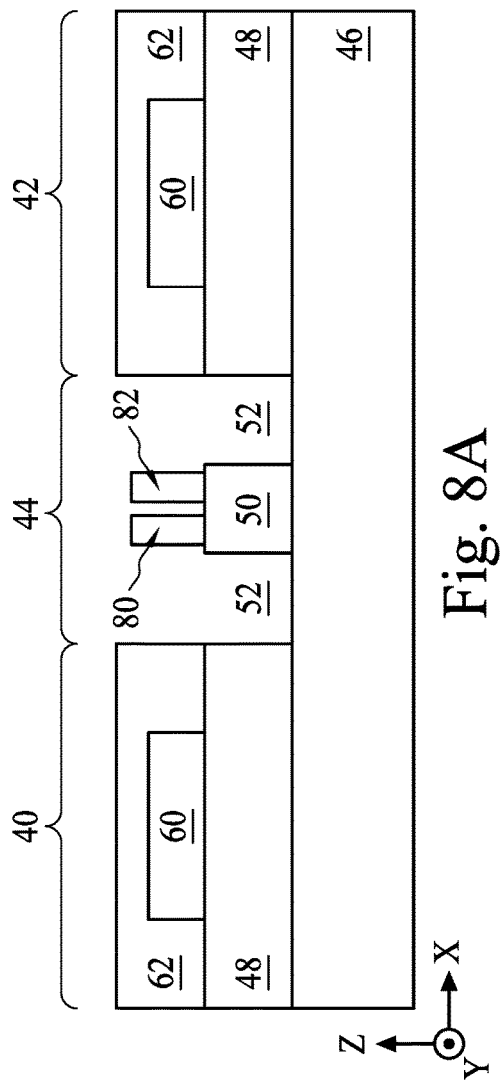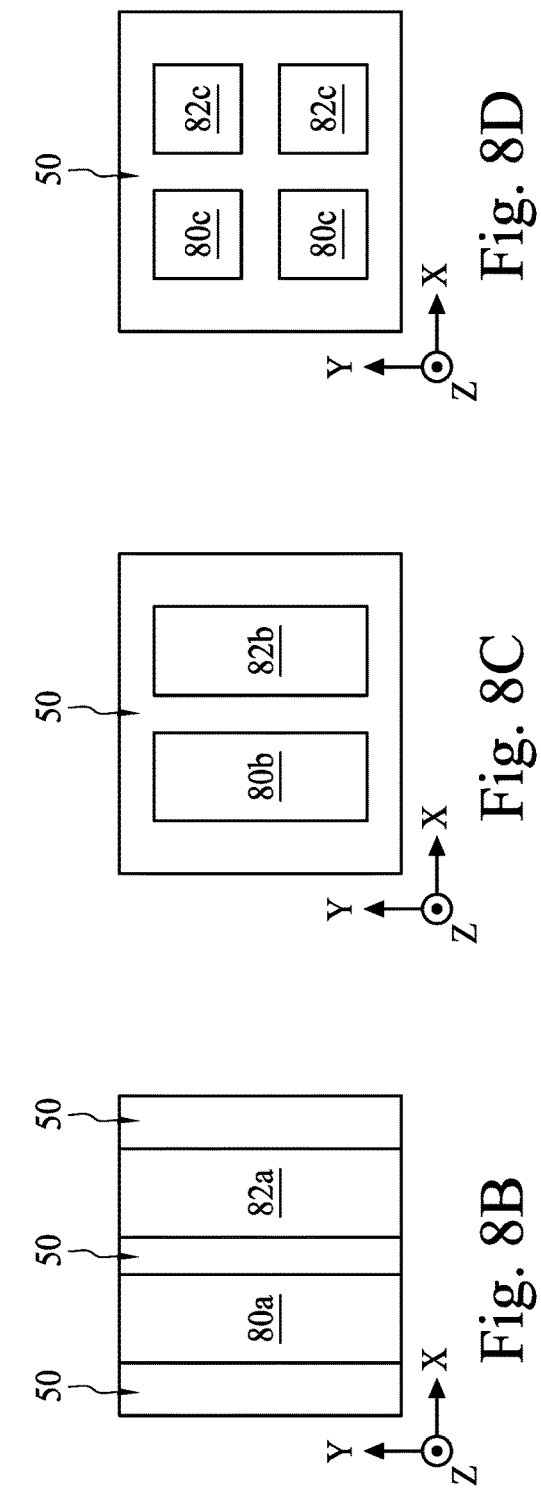

US 10,504,751 B2

PACKAGE STRUCTURES AND METHOD OF FORMING THE SAME

PRIORITY CLAIM AND CROSS-REFERENCE

This application is a division of U.S. patent application Ser. No. 14/688,437, filed on Apr. 16, 2015, entitled "Package Structures and Method of Forming the Same," which claims priority to and the benefit of U.S. Provisional Application No. 62/115,573, filed on Feb. 12, 2015, entitled "Package Structures and Method of Forming the Same," which disclosures are hereby incorporated herein by reference in their entireties.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 6 are cross sectional views of intermediate structures of a generic process to illustrate various general concepts in accordance with some embodiments.

FIGS. 7A through 7D are some example modifications to a dummy block in accordance with some embodiments.

FIGS. 8A through 8D are further example modifications to a dummy block in accordance with some embodiments.

DETAILED DESCRIPTION

Figure 9:
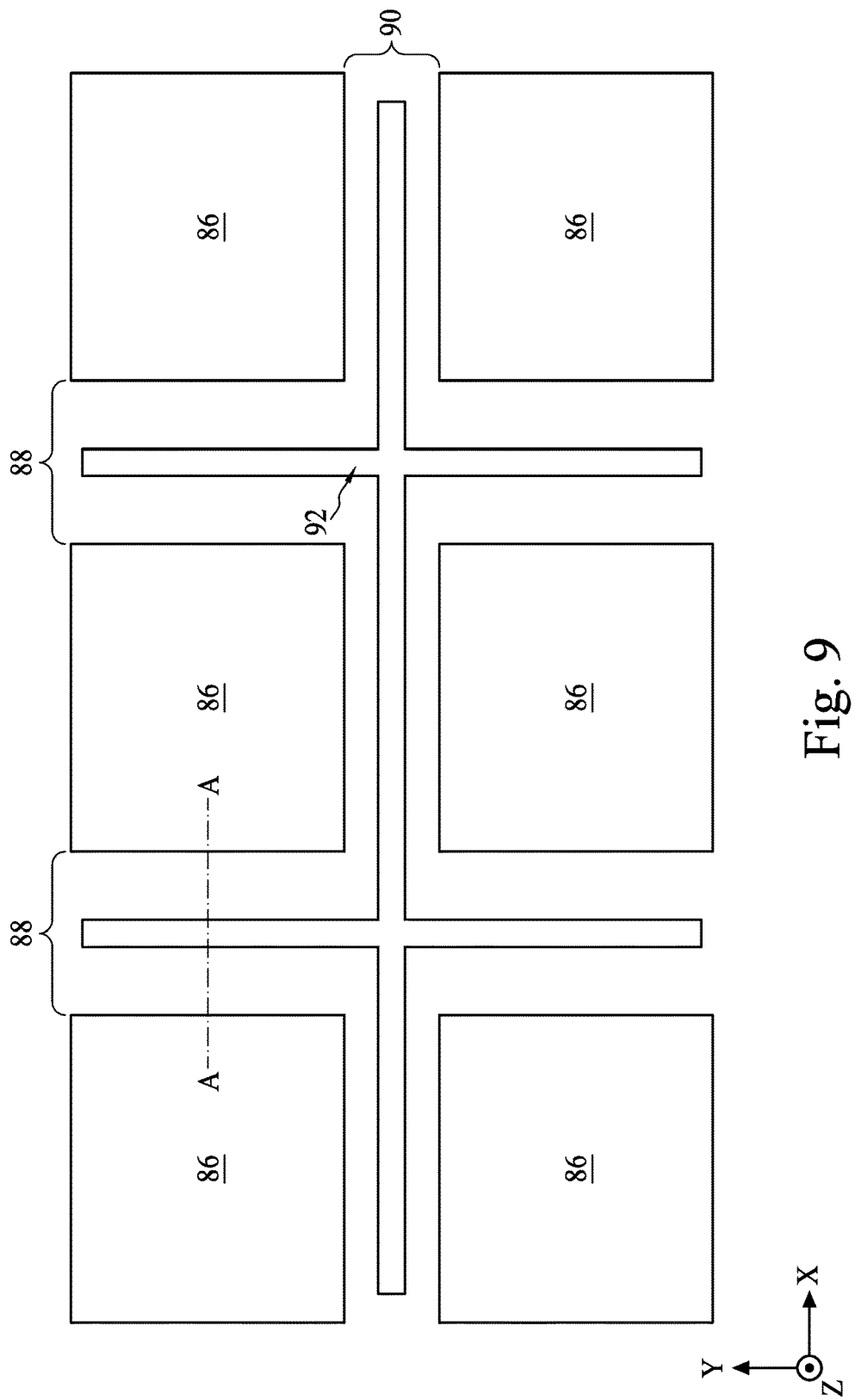
FIGS. 9 through 11 are layout views of multiple package component regions in an array and divided by scribe line regions with a dummy block in the scribe line regions in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 6 illustrate cross sectional views of intermediate structures of a generic process to illustrate various general concepts according to some embodiments. FIG. 1 illustrates a first region 40 and a second region 42 with a scribe line region 44 between the first region 40 and the second region 42. As illustrated, a support structure 46 and a first dielectric layer 48 on the support structure 46 are in FIG. 1. For example, the support structure 46 can include various structures formed in the first region 40 and the second region 42. Such structures can include a chip, an encapsulated chip, a substrate, or the like. An example of such a structure, and its formation, is illustrated in FIGS. 12 through 34. The first dielectric layer 48 can be a polymer, such as polybenzoxazole (PBO), polyimide, benzocyclobutene (BCB), or the like, which may further be a photo-sensitive material, and may be deposited using any acceptable deposition process, such as spin coating or the like.

In FIG. 2, the formation of the first dielectric layer 48 further includes patterning the first dielectric layer 48. The patterning may be by an acceptable process, such as by exposing the first dielectric layer 48 to light and developing the first dielectric layer 48 when the dielectric layer is a photo-sensitive material. The patterning creates a first-layer dummy block 50 and separation regions 52 in the scribe line region 44. For clarity, the first-layer dummy block 50 in this example is formed from the first dielectric layer 48 and results from the patterning of the first dielectric layer 48. Hence, the first-layer dummy block 50 can be a same material as the first dielectric layer 48. In other embodiments, the first-layer dummy block 50 can be formed after the first dielectric layer 48 is patterned, such as by depositing another material in the scribe line region 44 and patterning that material. In some other embodiments, the first-layer dummy block 50 can be a different material from the first dielectric layer 48.

Separation regions 52 separate the first-layer dummy block 50 in the scribe line region 44 from the first dielectric layer 48 in the first region 40 and the second region 42. The scribe line region 44 has a dimension 54, which may be, for example, in a range from about 400 μm to about 500 μm The first-layer dummy block 50 has a dimension 56, e.g., a width, which may be, for example, in a range from about 220 μm to about 320 μm The separation regions 52 have a dimension 58 from a sidewall of the first-layer dummy block 50 to a corresponding sidewall of the first dielectric layer 48 in one of the first region 40 or the second region 42, which dimension 58 may be, for example, in a range from about 50 μm to about 400 μm.

In FIG. 3, metallization patterns 60, e.g., which may include redistribution lines (RDLs), are formed on the first dielectric layer 48 in the first region 40 and in the second region 42. As an example to form metallization patterns 60, a seed layer (not shown) is formed over the first dielectric layer 48. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, Physical Vapor Deposition (PVD) or the like. A photo resist is then formed and patterned on the seed layer. The photo resist may be formed by spin coating or the like and may be exposed to light for patterning. The pattern of the photo resist corresponds to the metallization patterns 60. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization patterns 60.

In FIG. 4, a second dielectric layer 62 is deposited on the first dielectric layer 48 and the metallization patterns 60 in the first region 40 and the second region 42. The second dielectric layer 62 is further deposited in the separation regions 52 and on the first-layer dummy block 50 in the scribe line region 44. The second dielectric layer 62 can be a polymer, such as PBO, polyimide, BCB, or the like, which may further be a photo-sensitive material, and can be deposited using any acceptable deposition process, such as spin coating or the like. Under some circumstances, such as with spin coating, the second dielectric layer 62 may not be formed with a uniform, planar surface, such as in a location where the second dielectric layer 62 may fill a recess, such as the separation regions 52. As illustrated in FIG. 4, the second dielectric layer 62 has a depression 64 in the scribe line region 44 because of the presence of the separation regions 52. The first-layer dummy block 50 in the scribe line region 44 provides a rigid structural support and filler that can reduce the depression 64 compared to a similar circumstance without the first-layer dummy block 50.

In FIG. 5, the formation of the second dielectric layer 62 further includes patterning the second dielectric layer 62. The patterning may be by an acceptable process, such as by exposing the second dielectric layer 62 to light and developing the second dielectric layer 62 when the dielectric layer is a photo-sensitive material. The patterning creates a second-layer dummy block 66 on the first-layer dummy block 50 in the scribe line region 44. For clarity, the second-layer dummy block 66 in this example is formed from the second dielectric layer 62 and results from the patterning of the second dielectric layer 62. Hence, the second-layer dummy block 66 can be a same material as the second dielectric layer 62. In other embodiments, the second-layer dummy block 66 can be formed after the second dielectric layer 62 is patterned, such as by depositing another material on the first-layer dummy block 50 in the scribe line region 44 and patterning that material. In some other embodiments, the second-layer dummy block 66 can be a different material from the second dielectric layer 62.

In some embodiments where no further dielectric layer is formed on the second dielectric layer 62 using, e.g., spin coating, the second-layer dummy block 66 may be omitted. In such a circumstance, the second-layer dummy block 66 may not be needed as a rigid structural support or filler during the formation of another dielectric layer. In other embodiments where one or more additional dielectric layer is formed on the second dielectric layer 62 using, e.g., spin coating, the second-layer dummy block 66 may be present, and additional-layer dummy blocks may be present as appropriate. In such circumstances, the second-layer dummy block 66 and/or additional layer dummy blocks may provide rigid structural support and filler for the formation of one or more subsequently formed dielectric layers.

Due to the presence of the first-layer dummy block 50 during the formation of the second dielectric layer 62, a thickness of the second dielectric layer 62 in edge regions 68 proximate the scribe line region 44 can be more uniform with a thickness of the remainder of the second dielectric layer 62. For example, a thickness of the second dielectric layer 62 at the edge region 68 may deviate from a thickness of the second dielectric layer 62 at a center of the first region 40 (or second region 42) within a range from about 70 percent to about 80 percent. With the first-layer dummy block 50 being present during the formation of the second dielectric layer 62, the depth of the depression 64 can be reduced, which in turn reduces an effect on the second dielectric layer 62 in the edge regions 68. The larger the depth of a depression is during formation of the second dielectric layer 62, such as if the first-layer dummy block 50 is not present, the larger the effect the depression can be on the edge regions 68 of the second dielectric layer 62. For example, if the depth is large, a very thin second dielectric layer 62 in the edge regions 68 may occur, which can cause insufficient coverage and insulation of the metallization patterns 60 near the edge regions 68, which can in turn cause device failure. With the first-layer dummy block 50 present, the thickness of the second dielectric layer 62 at the edge regions 68 may not be significantly adversely affected, which may prevent device failure.

In FIG. 6, sawing 70 is performed in the scribe line region 44. The sawing 70 can singulate the first region 40 from the second region 42, e.g., with respective support structure 46, first dielectric layer 48, metallization patterns 60, and second dielectric layer 62, into individual package components. The package components can be a substrate, a chip scale package (CSP), integrated fan-out (or fan in) package, or the like. As illustrated, the sawing 70 can be through the first-layer dummy block 50 and the second-layer dummy block 66 (if present) which can cause first-layer dummy portions 72 and second-layer dummy portions 74 to remain in a remaining region of the scribe line region 44 on each singulated package component. The separation regions 52 can prevent the saw from contacting the first dielectric layer 48 and the second dielectric layer 62 in the first region 40 and the second region 42 during the sawing 70, which can help reduce saw-induced delamination of the first dielectric layer 48 and the second dielectric layer 62 in the first region 40 and the second region 42. One having ordinary skill in the art will readily understand that a scribe region typically circumscribes a package component before singulation, and that once singulated, first-layer dummy portions 72, second-layer dummy portions 74, and separation regions 52 can circumscribe each of the first region 40 and the second region 42. These general aspects discussed in FIGS. 1 through 6 may become clearer in the context of the example in FIGS. 12 through 34, although these aspects can be applied to different structures and processes.

FIGS. 7A through 7D illustrate some example modifications to a second-layer dummy block (or further layer dummy blocks) in accordance with some embodiments. X-Y-Z axes are illustrated for clarity and for ease of discussion. FIG. 7A illustrates a cross sectional view along an X-Z plane similar to the cross section illustrated in FIG. 5. Like components are depicted and numbered in FIGS. 5 and 7A, and discussion of those components is omitted for brevity. In FIG. 5, the second-layer dummy block 66 is co-terminous with the first-layer dummy block 50 in X and Y directions. For example, the second-layer dummy block 66 can be a replication of the first-layer dummy block 50 in a second layer, and a same mask can be used to pattern both the first-layer dummy block 50 and the second-layer dummy block 66. In FIG. 7A, and by further illustration in FIGS. 7B through 7D, the second-layer dummy block 76 is not co-extensive with the first-layer dummy block 50 in the X direction, and may further not be co-extensive in the Y direction. In FIG. 7A, a dimension 78, e.g., a width in an X direction, of the second-layer dummy block 76 is less than the dimension 54, e.g., in the same X direction, of the first-layer dummy block 50. In some embodiments, a ratio of the dimension 78 of the second-layer dummy block 76 to the dimension 54 of the first-layer dummy block 50 is in a range from about 0.5 to about 0.95.

Examples of the second-layer dummy block 76 are shown in layout views in FIGS. 7B through 7D. In FIG. 7B, a second-layer dummy block 76a is co-extensive with the first-layer dummy block 50 in a Y direction and is not co-extensive with the first-layer dummy block 50 in an X direction. In FIG. 7C, a second-layer dummy block 76b is not co-extensive with the first-layer dummy block 50 in a Y direction and is not co-extensive with the first-layer dummy block 50 in an X direction. In FIG. 7D, multiple separate second-layer dummy blocks 76c are on the first-layer dummy block 50 aligned in a Y direction. Each of the second-layer dummy blocks 76c is not co-extensive with the first-layer dummy block 50 in an X direction.

FIGS. 8A through 8D illustrate some further example modifications to a second-layer dummy block (or further layer dummy blocks) in accordance with some embodiments. X-Y-Z axes are illustrated for clarity and for ease of discussion. FIG. 8A illustrates a cross sectional view along an X-Z plane similar to the cross section illustrated in FIG. 5. Like components are depicted and numbered in FIGS. 5 and 8A, and discussion of those components is omitted for brevity. In FIG. 8A, and by further illustration in FIGS. 8B through 8D, the second-layer dummy block comprises at least a first portion 80 and a second portion 82 separated along a midline of the first-layer dummy block 50. Further, a sidewall of the first portion 80 proximate to the separation region 52 is not aligned with a sidewall of the first-layer dummy block 50 proximate to that same separation region 52, and a sidewall of the second portion 82 proximate to the separation region 52 is not aligned with a sidewall of the first-layer dummy block 50 proximate to that same separation region 52.

Examples of the second-layer dummy block first portion 80 and second portion 82 are shown in layout views in FIGS. 8B through 8D. In FIG. 8B, each of the first portion 80a and the second portion 82a is co-extensive with the first-layer dummy block 50 in a Y direction. In FIG. 8C, each of the first portion 80a and the second portion 82a is not co-extensive with the first-layer dummy block 50 in a Y direction. In FIG. 8D, multiple separate first portions 80c and multiple separate second portions 82c are on the first-layer dummy block 50 and are respectively aligned in a Y direction.

By having a second-layer (or subsequent layer) dummy block configured as illustrated in FIGS. 7A through 7D and 8A through 8D or similarly, misalignment concerns can be reduced while achieving a rigid structural support and filler as previously discussed.

Figure 10:
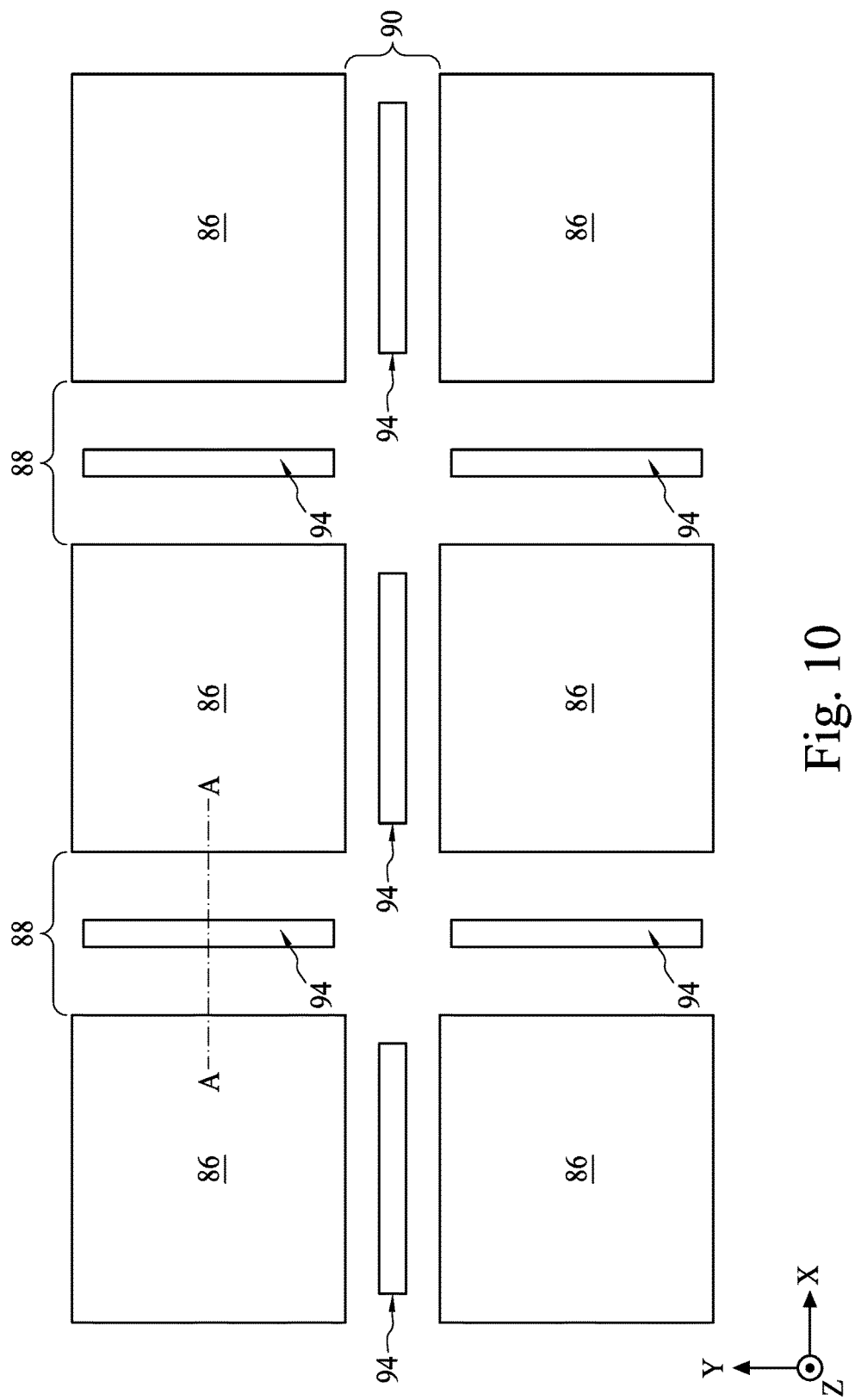
Figure 11:
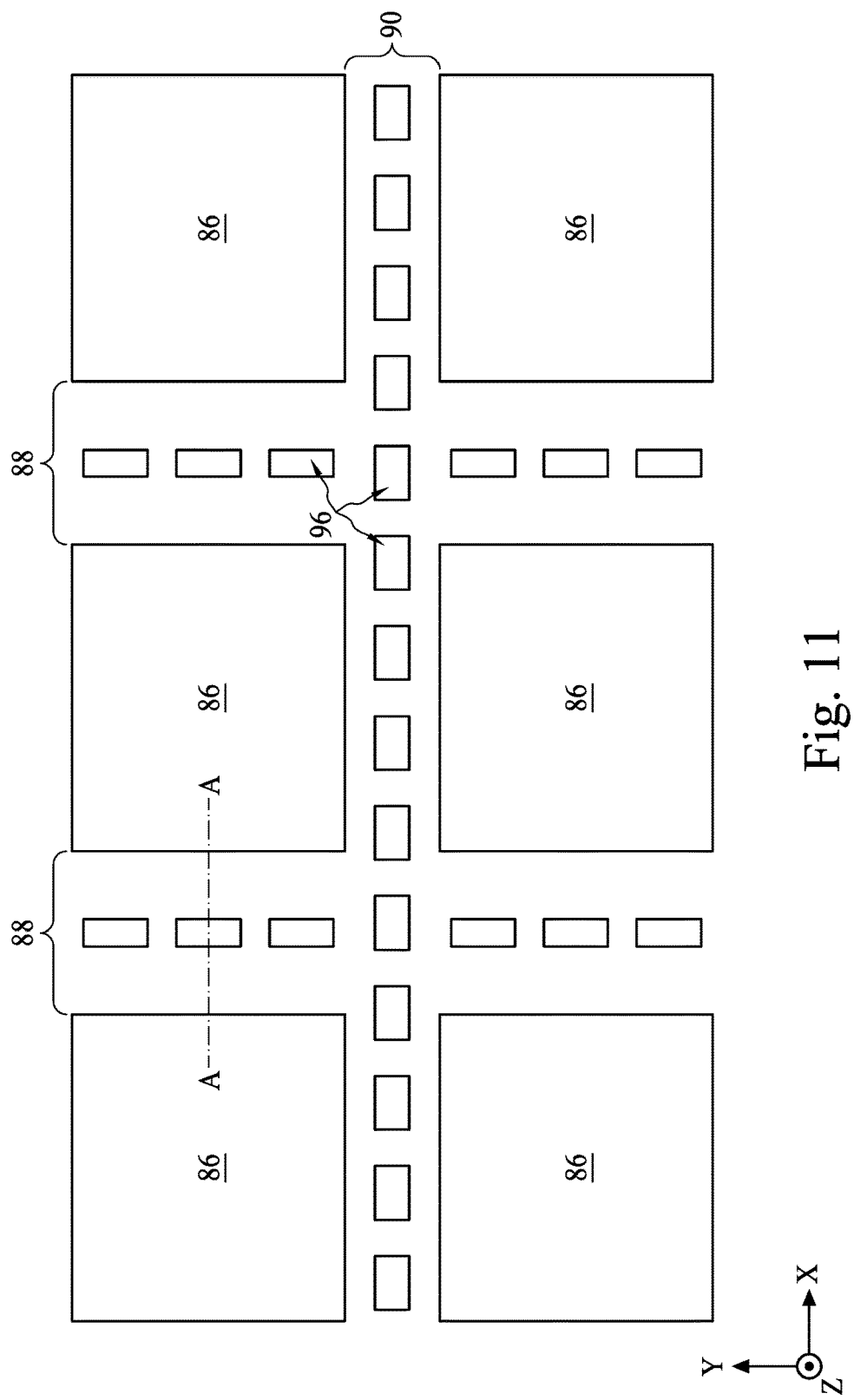

FIGS. 9 through 11 illustrate layout views of multiple package component regions 86 in an array and divided by Y direction scribe line regions 88 and X direction scribe line regions 90. Line A-A in FIGS. 9 through 11 illustrates an example cross section of FIGS. 1 through 6, 7A, and 8A. FIGS. 9 through 11 illustrate configurations of first-layer dummy blocks 92, 94, and 96, respectively. Second-layer (or subsequent layer) dummy blocks can have any of the configurations with respect to the first-layer dummy blocks 92, 94, or 96 as previously discussed. In FIG. 9, a continuous first-layer dummy block 92 extends continuously along both the Y direction scribe line regions 88 and the X direction scribe line regions 90. An intersection of the continuous first-layer dummy block 92 is formed in an intersection of a Y direction scribe line region 88 and a X direction scribe line region 90 by a portion of the continuous first-layer dummy block 92 extending along the Y direction scribe line region 88 and a portion of the continuous first-layer dummy block 92 extending along the X direction scribe line region 90. In FIG. 10, bar first-layer dummy blocks 94 extend substantially along corresponding edges of package component regions 86 and do not extend significantly into intersection regions where a Y direction scribe line region 88 and an X direction scribe line region 90 intersect. In FIG. 11, multiple discrete first-layer dummy blocks 94 are aligned in respective Y direction scribe line regions 88 and X direction scribe line regions 90.

Figure 12:
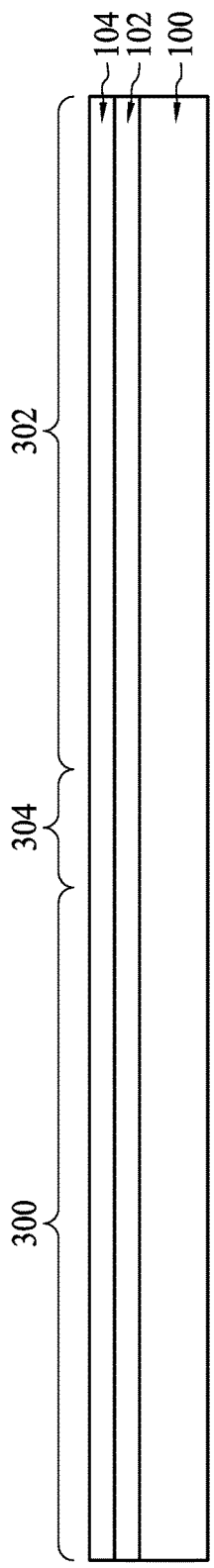
FIGS. 12 through 34 are cross sectional views of intermediate steps during a process for forming a package-on-package (PoP) structure in accordance with some embodiments.

FIGS. 12 through 34 illustrate cross sectional views of intermediate steps during a process for forming a package-on-package (PoP) structure in accordance with some embodiments. FIG. 12 illustrates a carrier substrate 100 and a release layer 102 formed on the carrier substrate 100. A first package region 300 and a second package region 302 for the formation of a first package and a second package, respectively, are illustrated. A scribe line region 304 is between the first package region 300 and the second package region 302. One having ordinary skill in the art will readily understand that scribe line regions can circumscribe each of the first package region 300 and the second package region 302, and that discussion relating to the scribe line region 304 similarly applies to other scribe line regions.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a Light-to-Heat-Conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Figure 13:
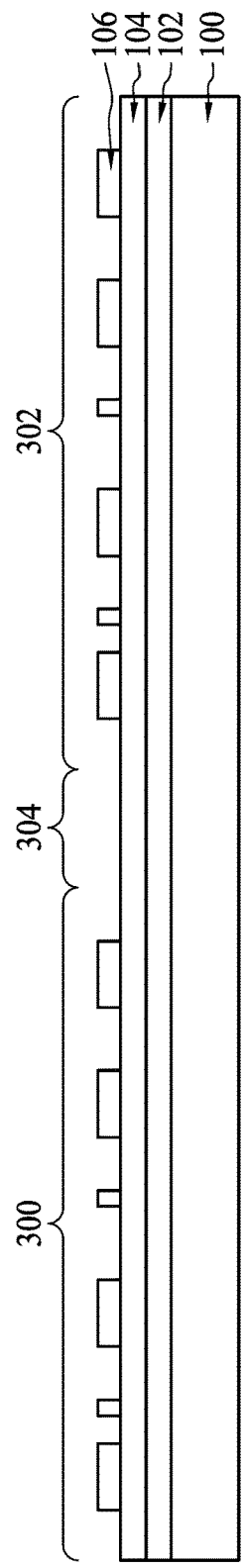
Figure 14:
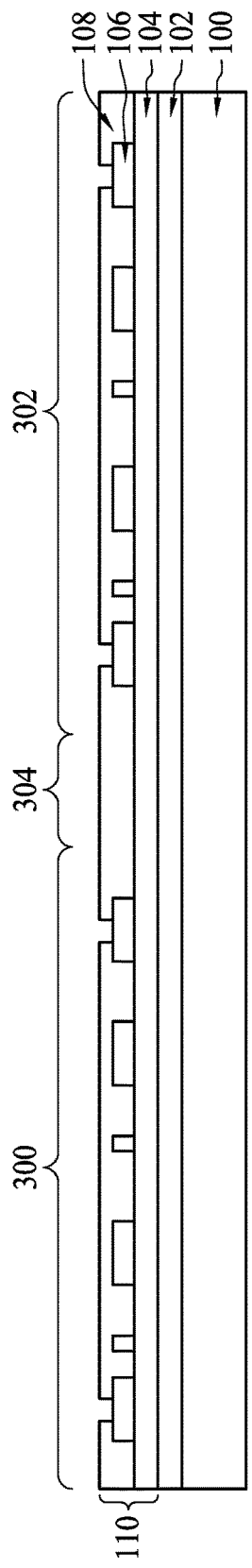

In FIGS. 12 through 14, a back side redistribution structure 110 is formed. The back side redistribution structure comprises dielectric layers 104 and 108 and a metallization pattern 106. As illustrated in FIG. 12, the dielectric layer 104 is formed on the release layer 102. The bottom surface of the dielectric layer 104 may be in contact with the top surface of the release layer 102. In some embodiments, the dielectric layer 104 is formed of a polymer, such as PBO, polyimide, BCB, or the like. In other embodiments, the dielectric layer 104 is formed of a nitride such as silicon nitride; an oxide such as silicon oxide, PhosphoSilicate Glass (PSG), Boro-Silicate Glass (BSG), Boron-doped PhosphoSilicate Glass (BPSG), or the like; or the like. The dielectric layer 104 may be formed by any acceptable deposition process, such as spin coating, chemical vapor deposition (CVD), laminating, the like, or a combination thereof.

In FIG. 13, the metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

In FIG. 14, the dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

As illustrated, the back side redistribution structure 110 includes two dielectric layers 104 and 108 and one metallization pattern 106. In other embodiments, the back side redistribution structure 110 can comprise any number of dielectric layers, metallization patterns, and vias. One or more additional metallization pattern and dielectric layer may be formed in the back side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Figure 15:
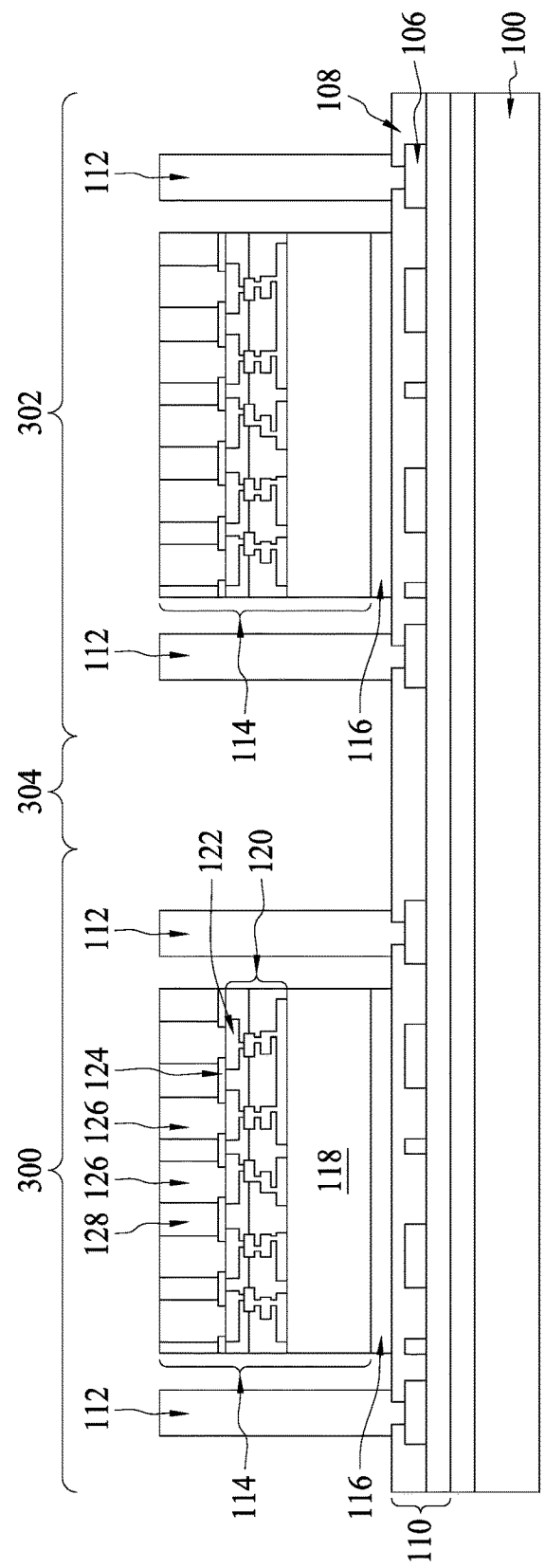

In FIG. 15, through vias 112 are formed. As an example to form the through vias 112, a seed layer is formed over the back side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Further in FIG. 15, integrated circuit dies 114 are adhered to the dielectric layer 108 by an adhesive 116. As illustrated, one integrated circuit die 114 is adhered in each of the first package region 300 and the second package region 302, and in other embodiments, more integrated circuit dies may be adhered in each region. Before being adhered to the dielectric layer 108, the integrated circuit dies 114 may be processed according to applicable manufacturing processes to form integrated circuits in the integrated circuit dies 114. For example, the integrated circuit dies 114 each comprise a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally co-terminus with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back sides of the integrated circuit dies 114 and adheres the integrated circuit dies 114 to the back side redistribution structure 110, such as the dielectric layer 108 in the illustration. The adhesive 116 may be any suitable adhesive, epoxy, or the like. The adhesive 116 may be applied to a back side of the integrated circuit dies 114, such as to a back side of the respective semiconductor wafer. The integrated circuit dies 114 may be singulated, such as by sawing or dicing, and adhered to the dielectric layer 108 by the adhesive 116 using, for example, a pick-and-place tool.

Figure 16:
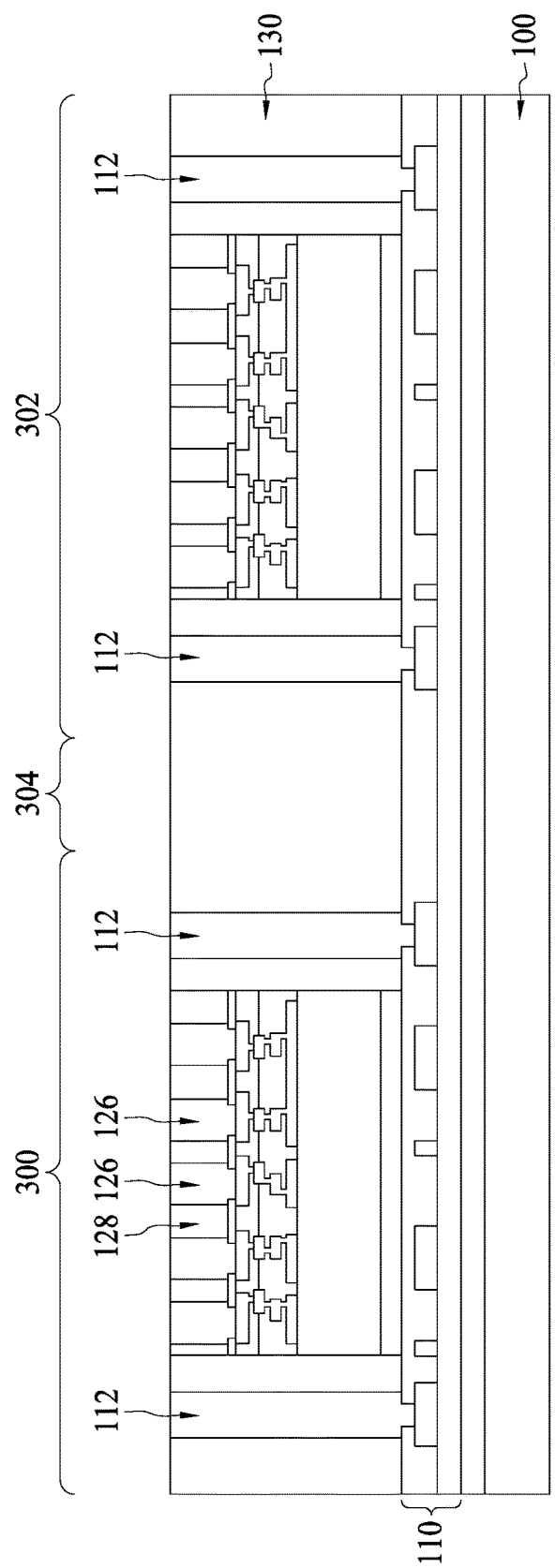

In FIG. 16, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are co-planar after the grinding process. In some embodiments, the grinding may be omitted, for example, if through vias 112 and die connectors 126 are already exposed.

In FIGS. 17 through 27, a front side redistribution structure 160 is formed. As will be illustrated in FIG. 27, the front side redistribution structure 160 comprises dielectric layers 132, 140, 148, and 156 and metallization patterns 138, 146, and 154.

Figure 17:
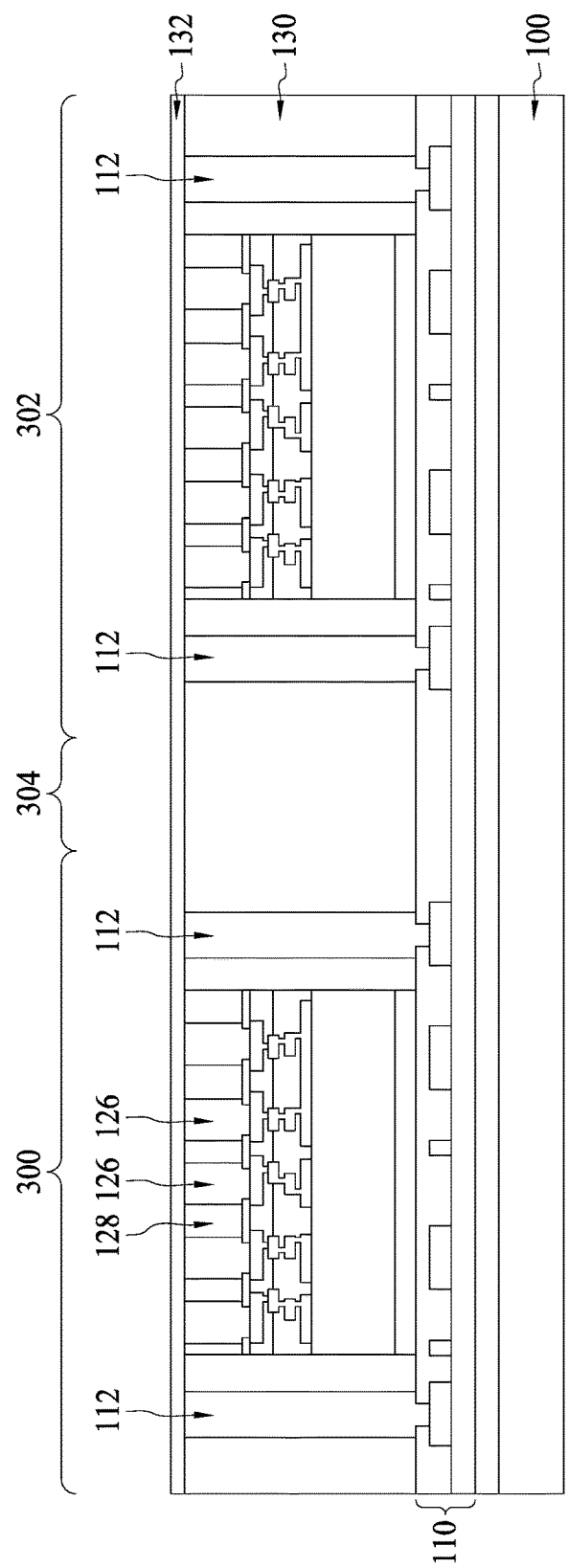

In FIG. 17, the dielectric layer 132 is deposited on the encapsulant 130, through vias 112, and die connectors 126. In some embodiments, the dielectric layer 132 can be a polymer, which may be a photo-sensitive material such as PBO, polyimide, BCB, or the like, that may be easily patterned using a lithography mask. The dielectric layer 132 may be deposited by spin coating or the like.

Figure 18:
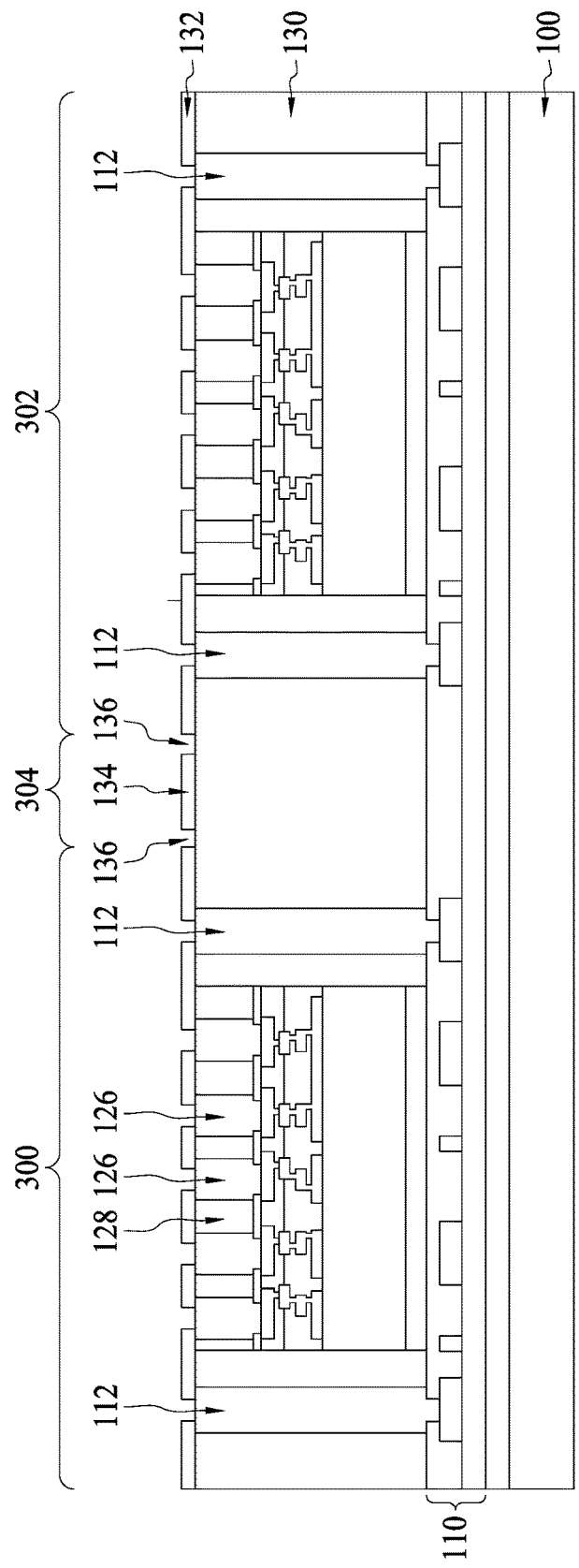

In FIG. 18, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure. The patterning further forms a first-layer dummy block 134 and separation regions 136 in the scribe line region 304. The first-layer dummy block 134 and separation regions 136 can have any configuration or aspect generally discussed with respect to FIGS. 1 through 6, 7A through 7D, 8A through 8D, and 9 through 11.

Figure 19:
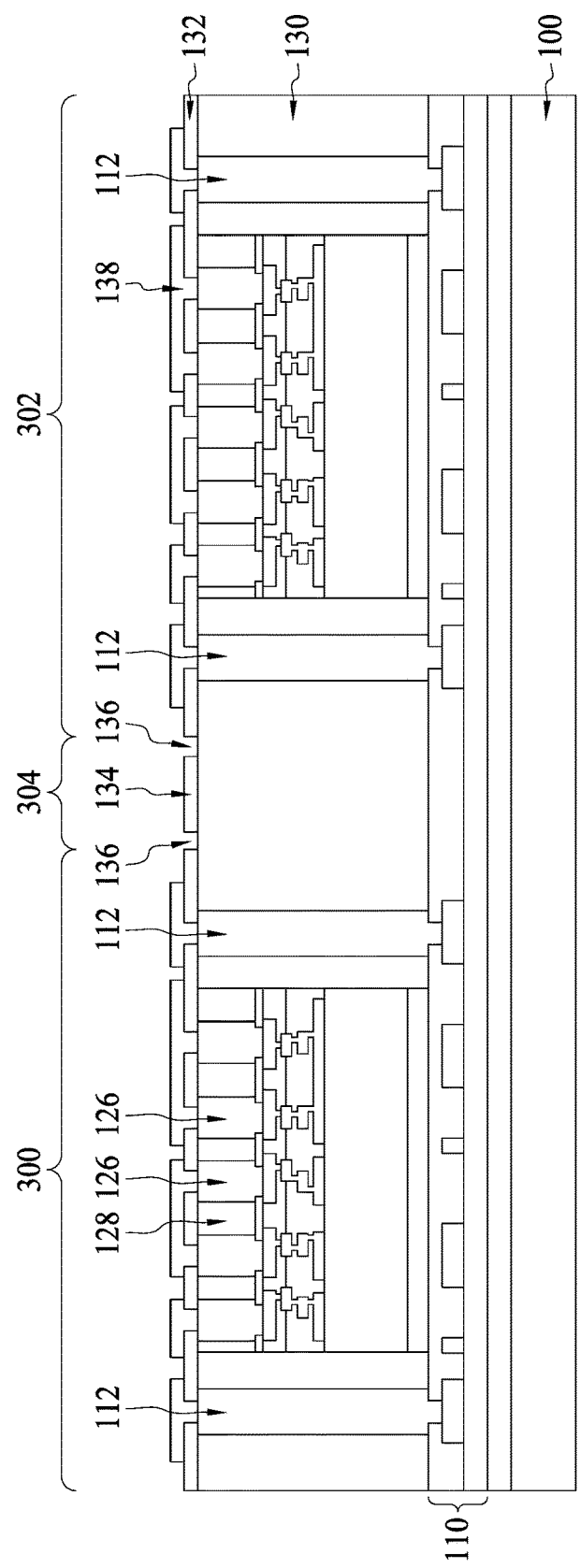

In FIG. 19, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 20:
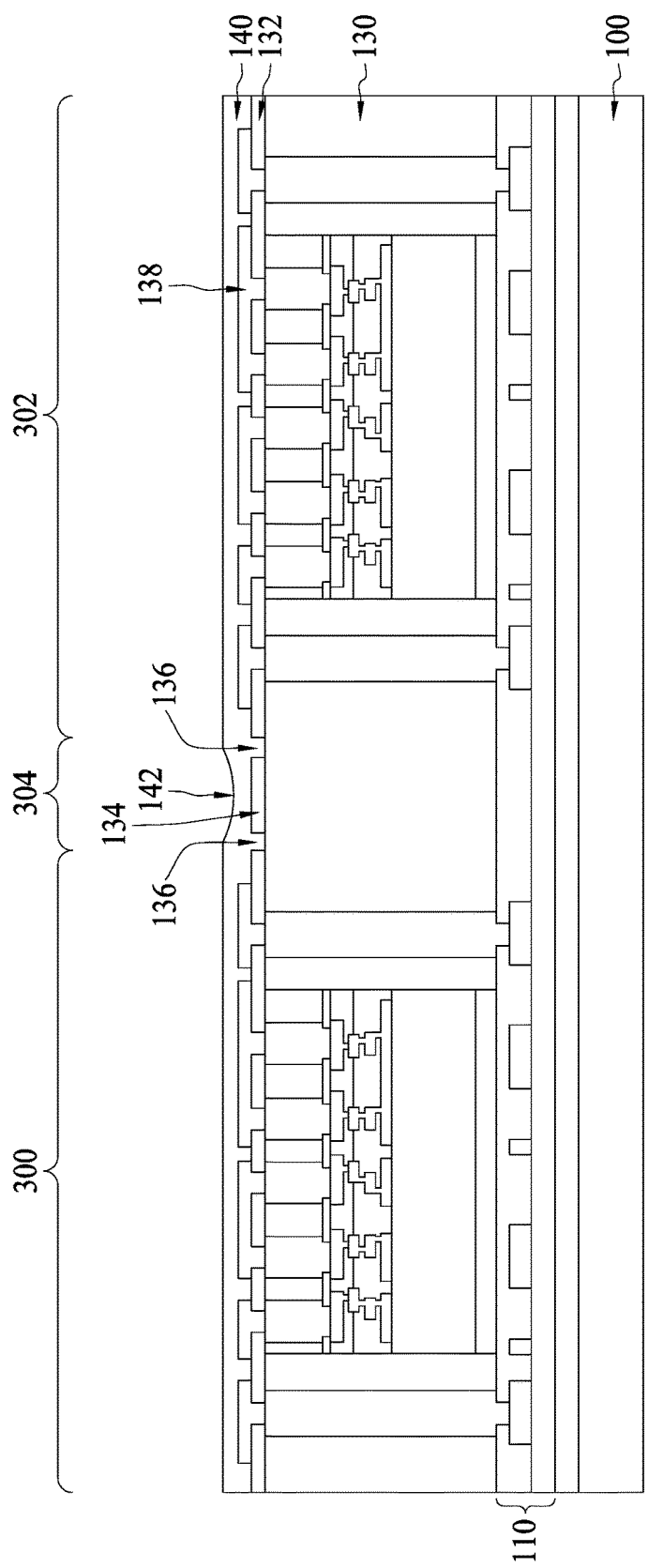

In FIG. 20, the dielectric layer 140 is deposited on the metallization pattern 138 and the dielectric layer 132. In some embodiments, the dielectric layer 140 can be a polymer, which may be a photo-sensitive material such as PBO, polyimide, BCB, or the like, that may be easily patterned using a lithography mask. The dielectric layer 140 may be deposited by spin coating or the like. Due to the presence of separation regions 136 in the dielectric layer 132, a depression 142 in the top surface of the dielectric layer 140 may be formed during the deposition.

Figure 21:
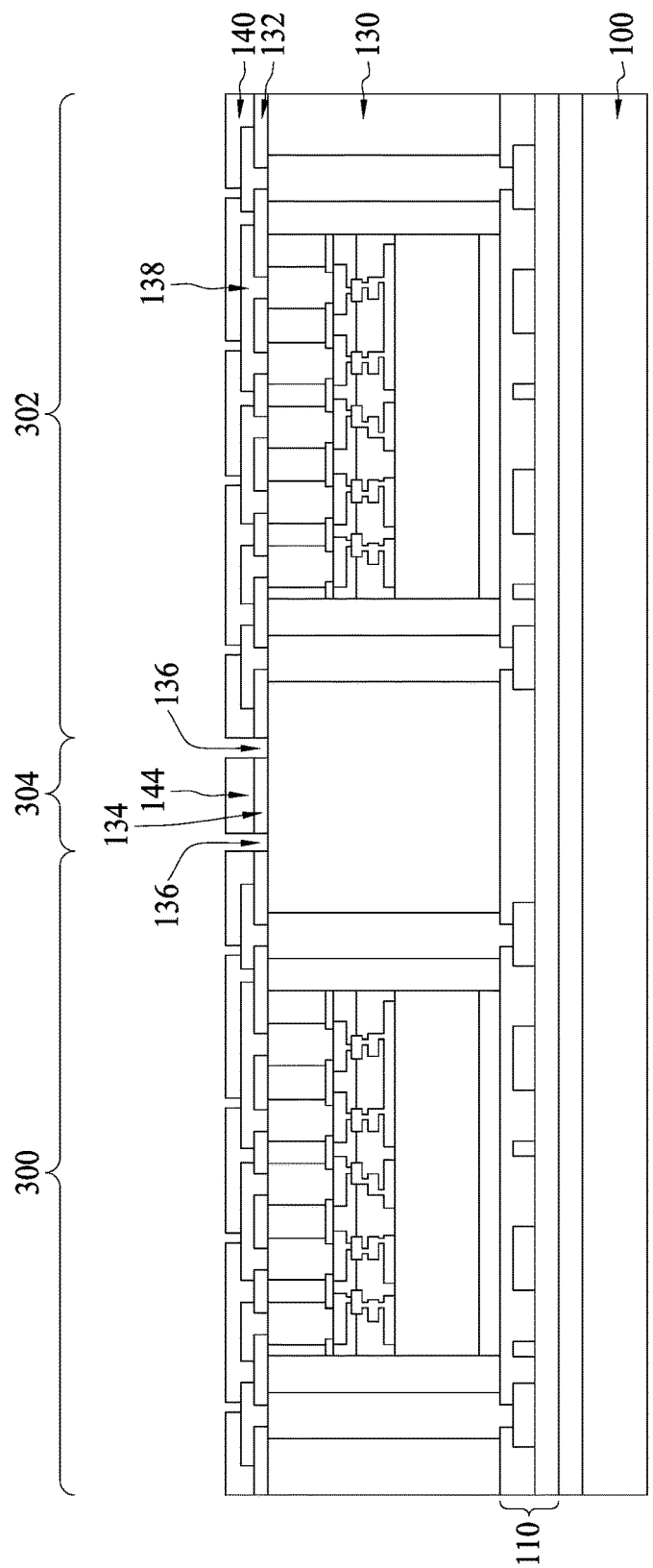

In FIG. 21, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure. The patterning further forms a second-layer dummy block 144 on the first-layer dummy block 134 and between the separation regions 136 in the scribe line region 304. The second-layer dummy block 144 can have any configuration or aspect generally discussed with respect to FIGS. 1 through 6, 7A through 7D, 8A through 8D, and 9 through 11.

Figure 22:
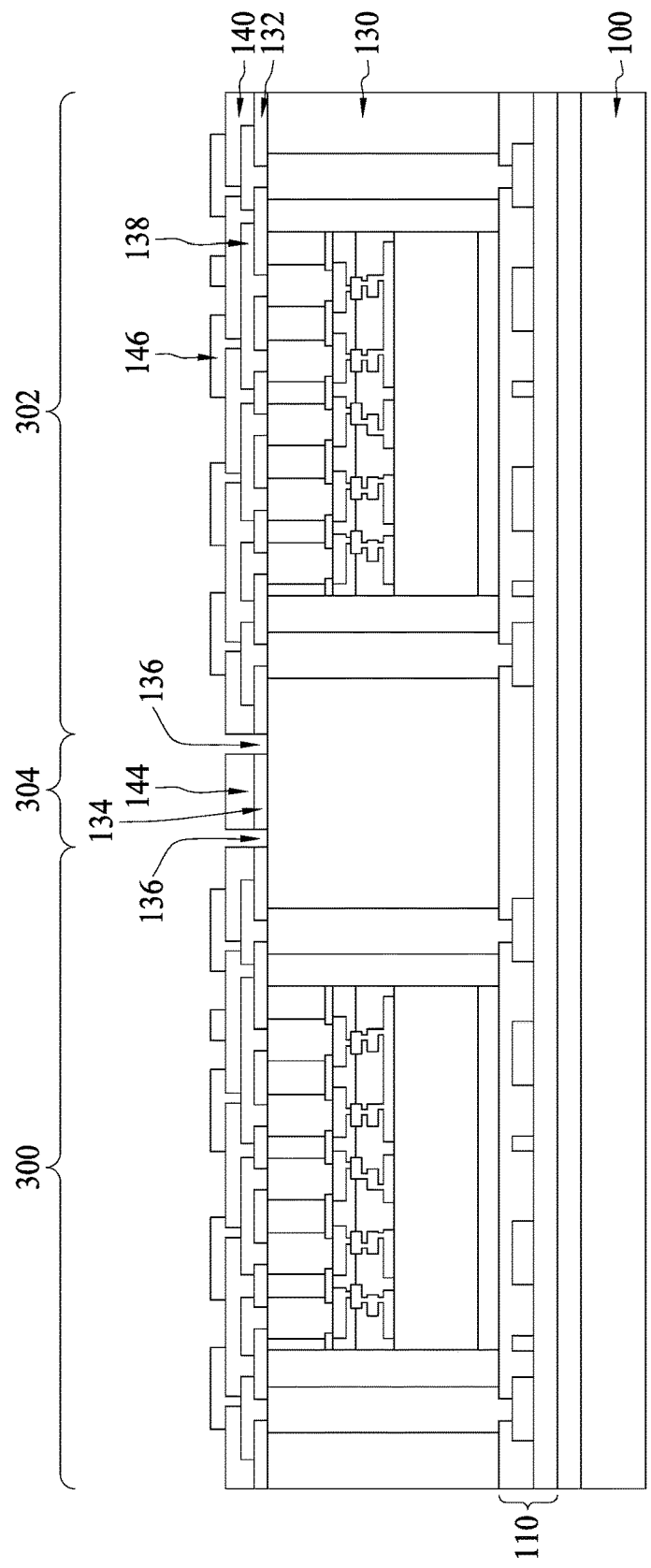

In FIG. 22, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 23:
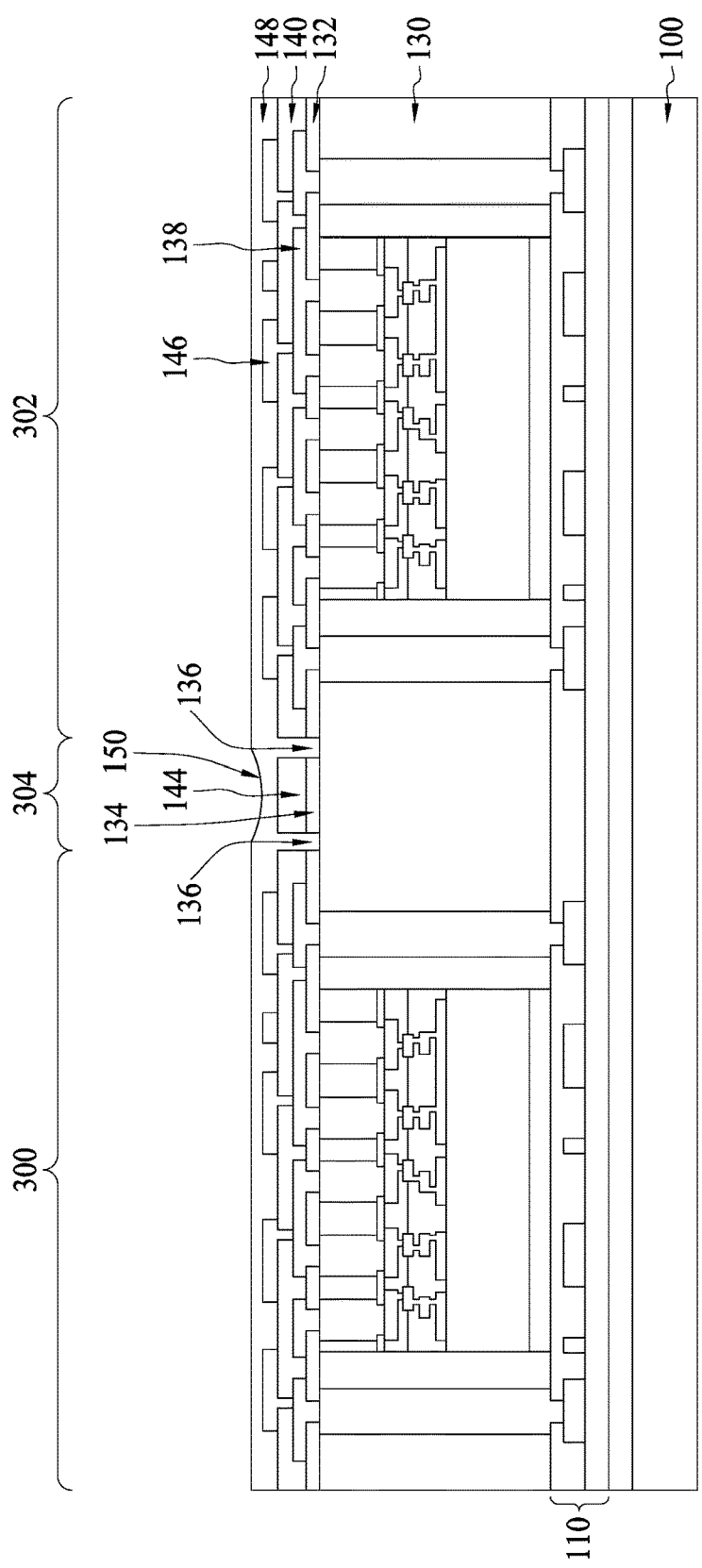

In FIG. 23, the dielectric layer 148 is deposited on the metallization pattern 146 and the dielectric layer 140. In some embodiments, the dielectric layer 148 can be a polymer, which may be a photo-sensitive material such as PBO, polyimide, BCB, or the like, that may be easily patterned using a lithography mask. The dielectric layer 148 may be deposited by spin coating or the like. Due to the presence of separation regions 136 in the dielectric layers 132 and 140, a depression 150 in the top surface of the dielectric layer 148 may be formed during the deposition.

Figure 24:
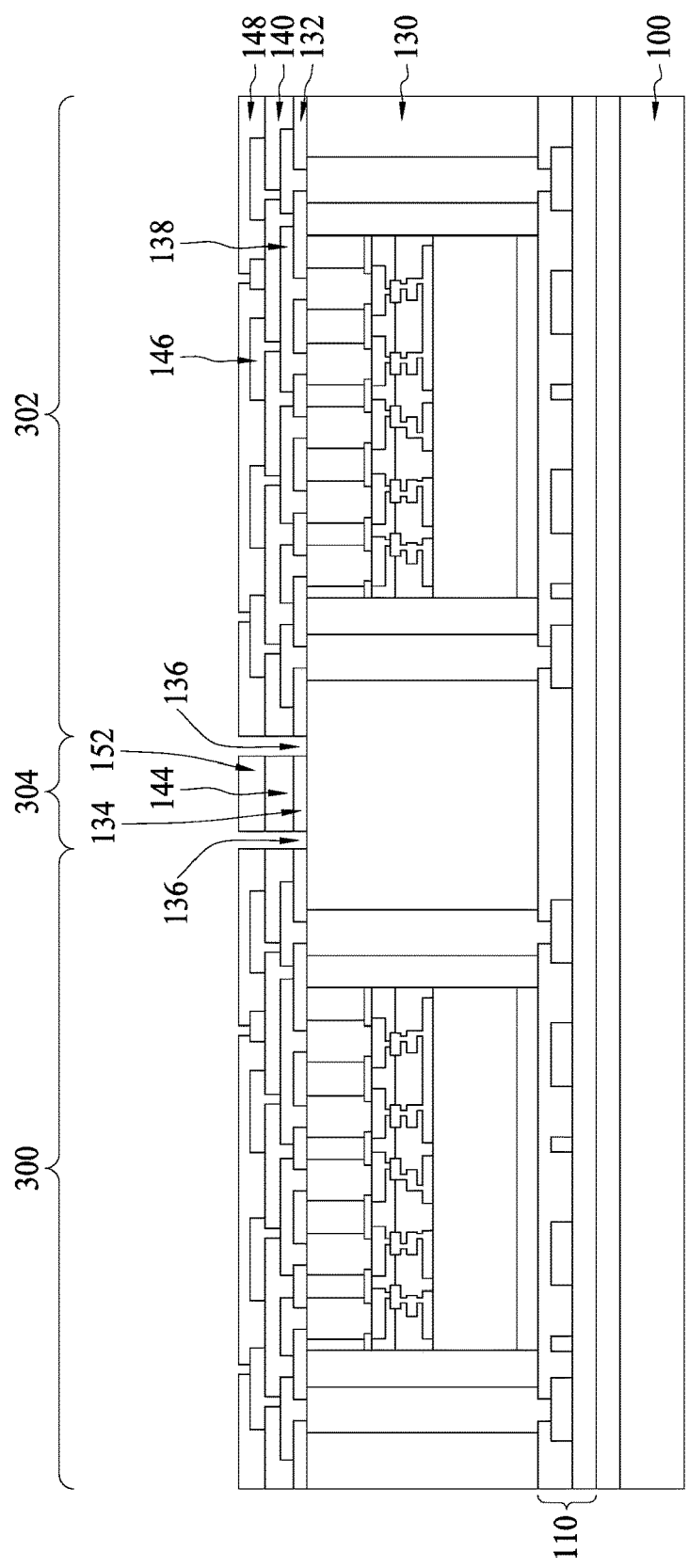

In FIG. 24, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure. The patterning further forms a third-layer dummy block 152 on the first-layer dummy block 134 and the second-layer dummy block 144 and between the separation regions 136 in the scribe line region 304. The third-layer dummy block 152 can have any configuration or aspect generally discussed with respect to FIGS. 1 through 6, 7A through 7D, 8A through 8D, and 9 through 11.

Figure 25:
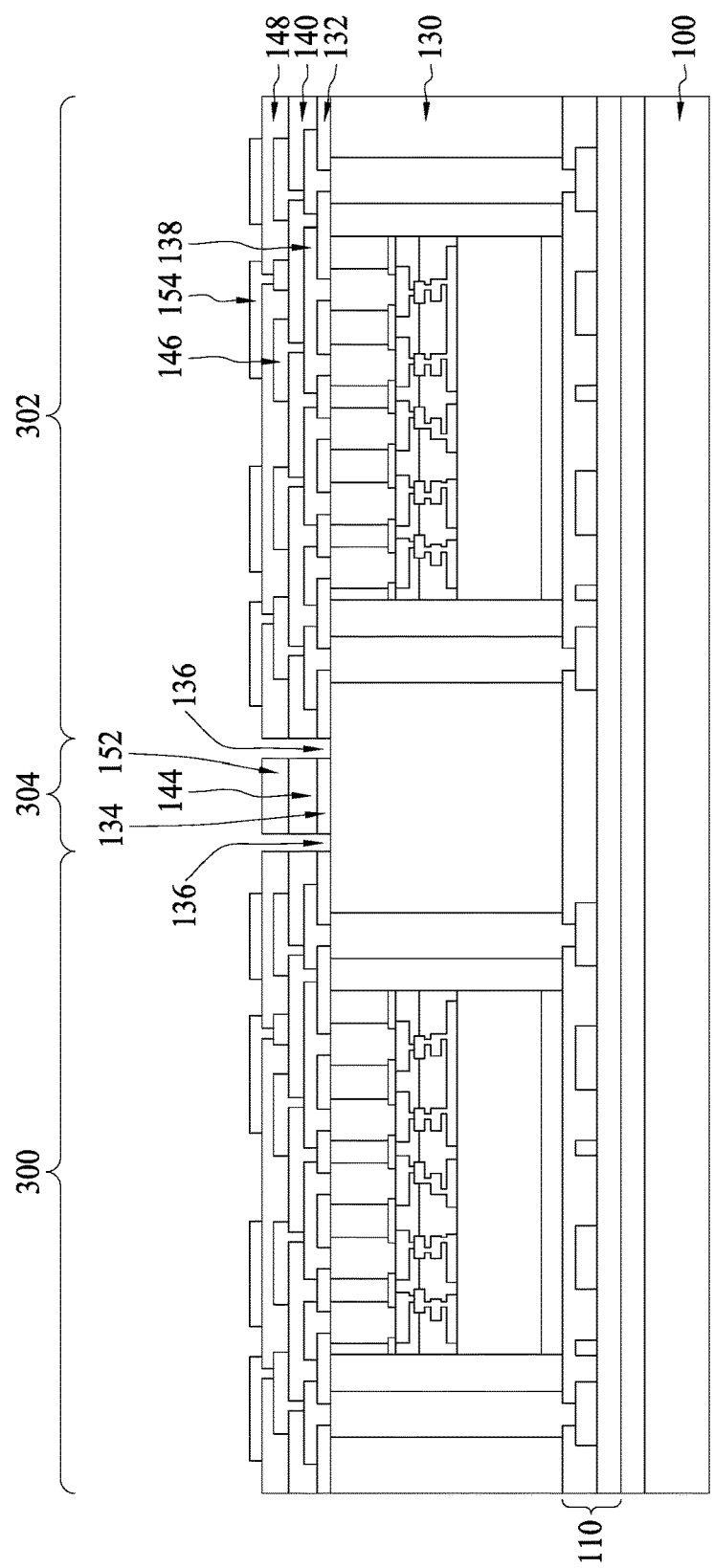

In FIG. 25, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 26:
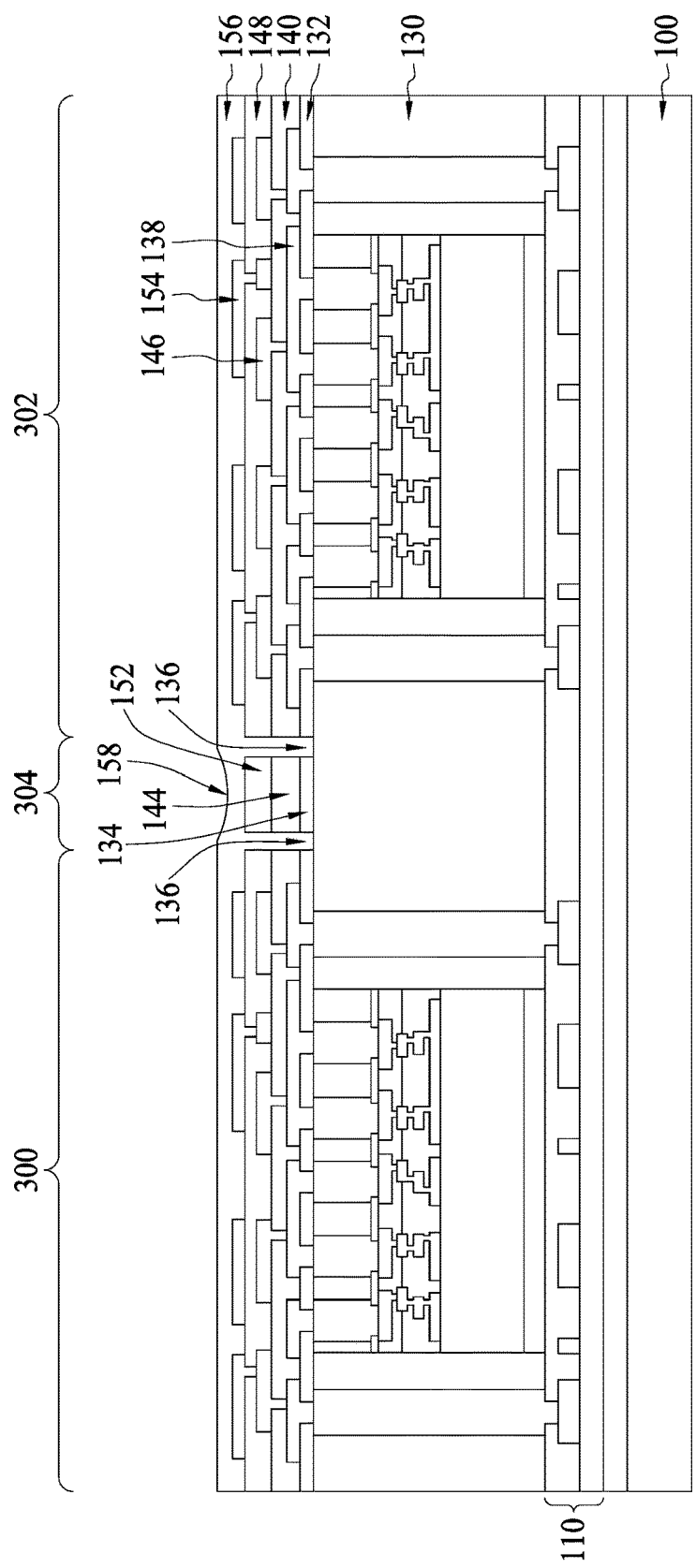

In FIG. 26, the dielectric layer 156 is deposited on the metallization pattern 154 and the dielectric layer 148. In some embodiments, the dielectric layer 156 can be a polymer, which may be a photo-sensitive material such as PBO, polyimide, BCB, or the like, that may be easily patterned using a lithography mask. The dielectric layer 156 may be deposited by spin coating or the like. Due to the presence of separation regions 136 in the dielectric layers 132, 140, and 148, a depression 158 in the top surface of the dielectric layer 156 may be formed during the deposition.

Figure 27:
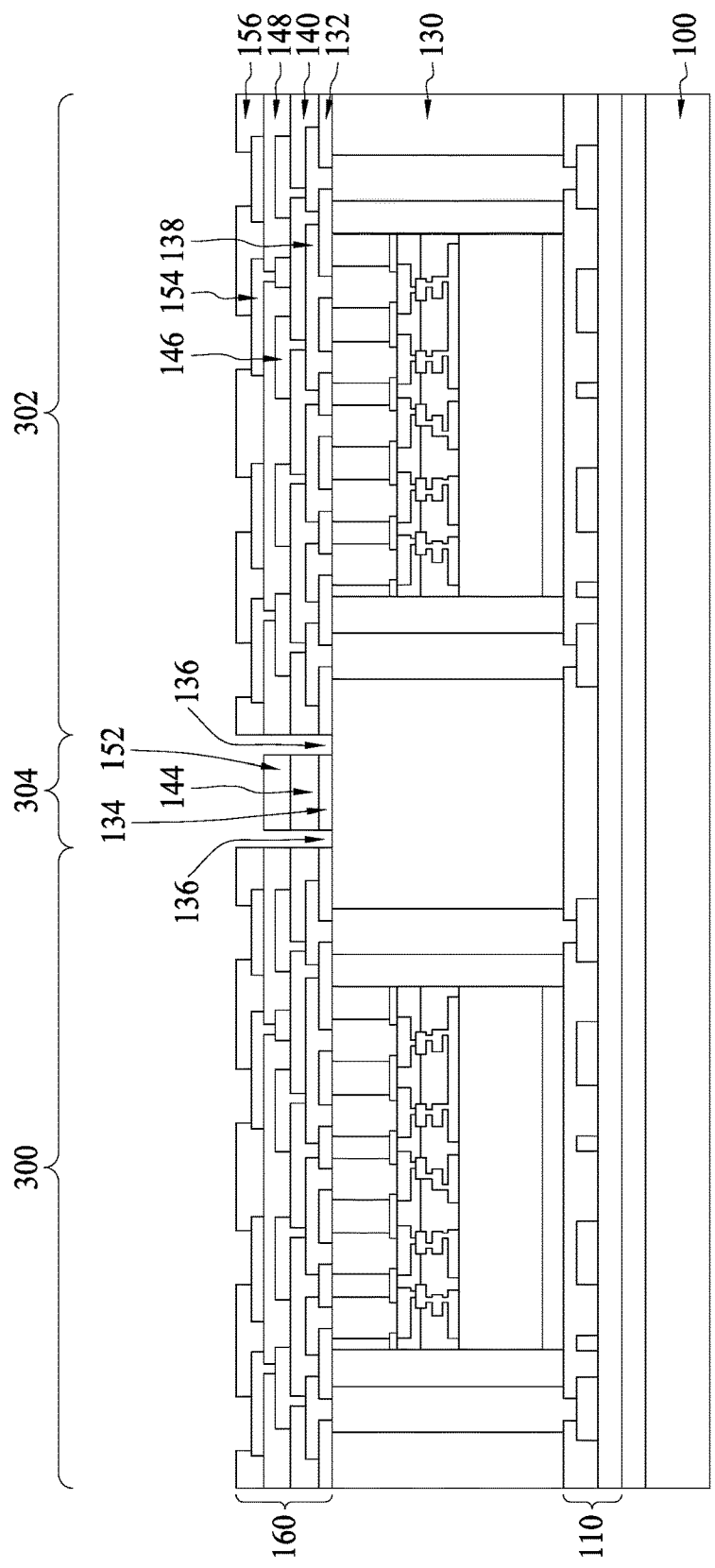

In FIG. 27, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure. The patterning of the dielectric layer 156 removes the dielectric layer 156 from the scribe line region 304. As will be shown subsequently, no further dielectric layer will be deposited on dielectric layer 156, and hence, a layer dummy block corresponding to the dielectric layer 156 can be omitted.

The front side redistribution structure 160 is shown as an example. More or fewer dielectric layers and metallization patterns may be formed in the front side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Similar to the discussion of FIG. 5, due to the presence of respective ones the dummy blocks 134, 144, and 152 during the deposition of an overlying dielectric layer, e.g., dielectric layers 140, 148, and 156, a thickness of the overlying dielectric layer in edge regions proximate the scribe line region 304 can be more uniform with a thickness of the remainder of the dielectric layer. The depth of the depressions 142, 150, and 158 can be reduced, which in turn reduces an effect on the respective dielectric layer in the edge regions. With the dummy blocks 134, 144, and 152 present, the thicknesses of the dielectric layers 140, 148, and 156 at the edge regions may not be significantly adversely affected, which may prevent device failure.

Figure 28:
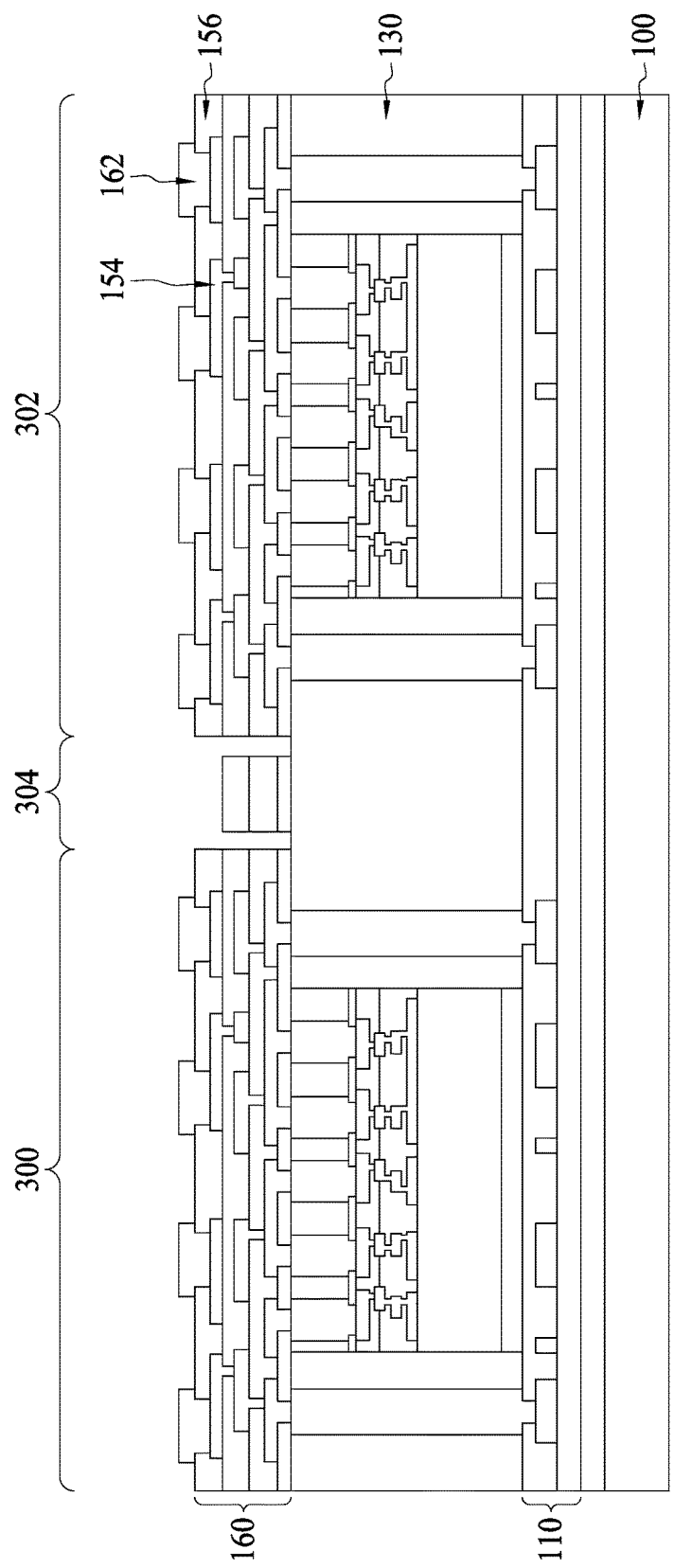

In FIG. 28, pads 162, which may be referred to as Under Bump Metallurgies (UBMs), are formed on an exterior side of the front side redistribution structure 160. In the illustrated embodiment, pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162.

Figure 29:
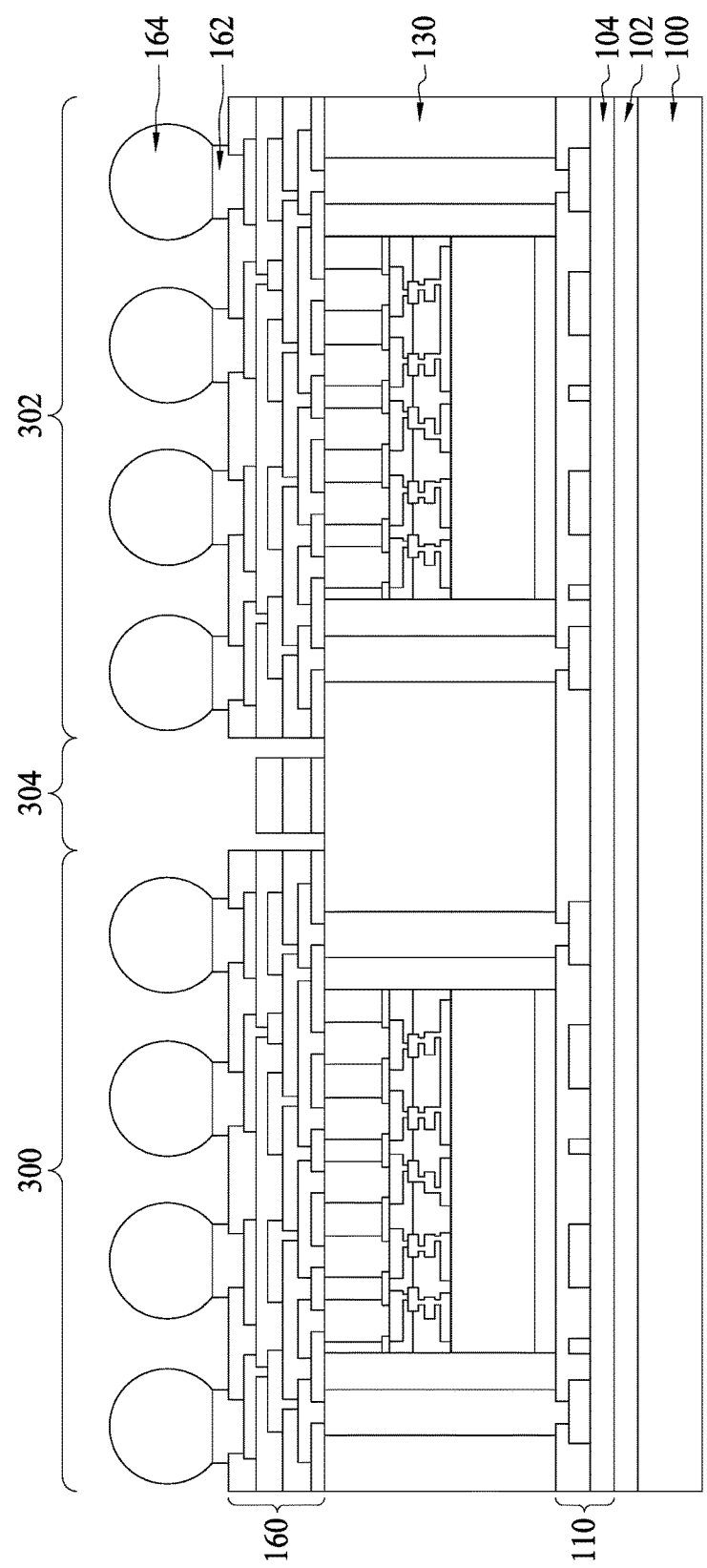

In FIG. 29, external electrical connectors 164, such as solder balls like ball grid array (BGA) balls, are formed on the pads 162. The external electrical connectors 164 may include a low-temperature reflowable material such as solder, which may be lead-free or lead-containing. The external electrical connectors 164 may be formed by using an appropriate ball drop process. In some embodiments, the pads 162 can be omitted, and the external electrical connectors 164 can be formed directly on the metallization pattern 154 through the openings through the dielectric layer 156.

Figure 30:
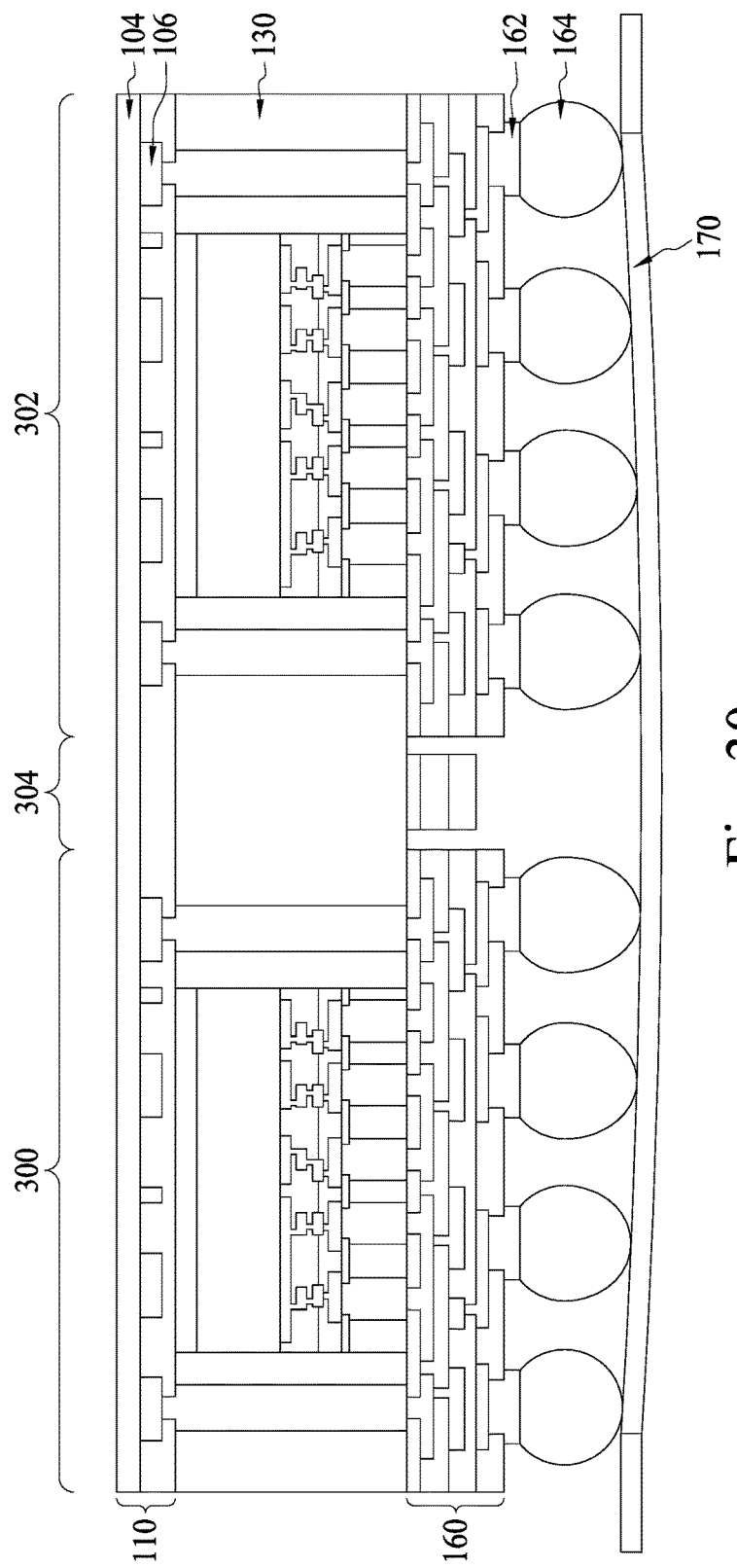

In FIG. 30, a carrier substrate de-bonding is performed to detach (de-bond) the carrier substrate 100 from the back side redistribution structure 110, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 170.

Figure 31:
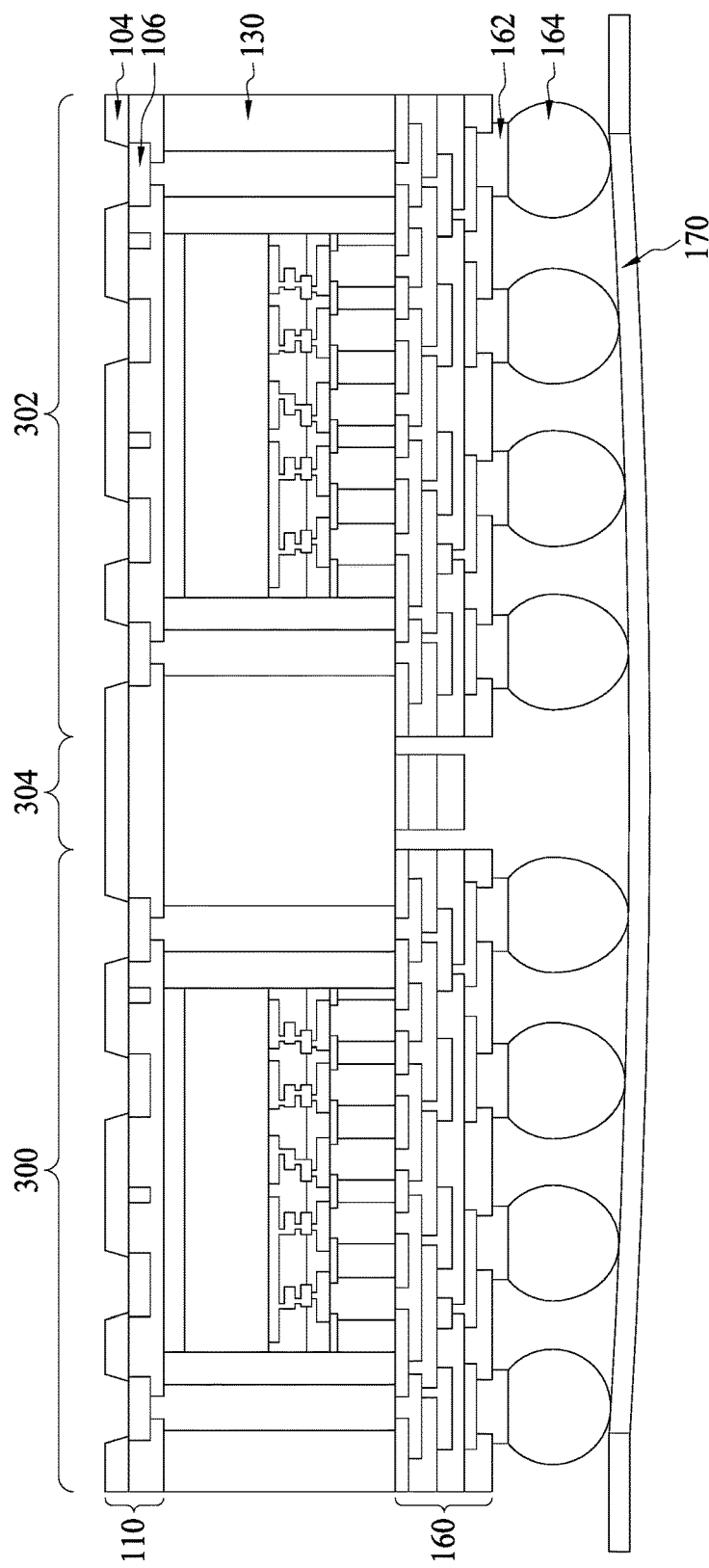

In FIG. 31, openings are formed through the dielectric layer 104 to expose portions of the metallization pattern 106. The openings may be formed, for example, using laser drilling, etching, or the like.

Figure 32:
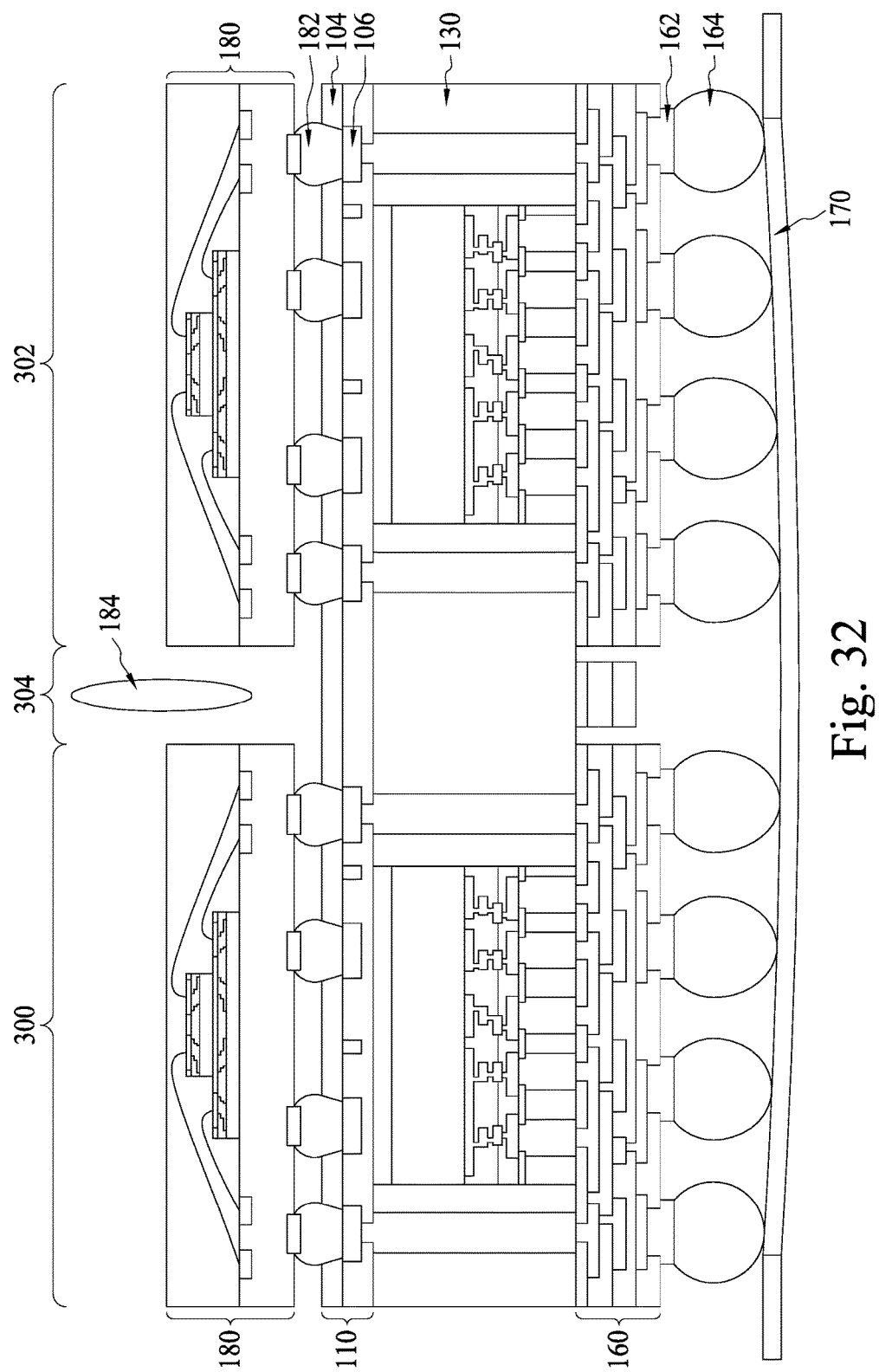

In FIG. 32, a package 180 is attached to the back side redistribution structure 110 in each of the first package region 300 and the second package region 302 using external electrical connectors 182. The packages 180 can be and/or comprise any package component. For example, as illustrated, the packages 180 each comprise a substrate, two stacked integrated circuit dies on the substrate, wire bonds electrically coupling the integrated circuit dies to the substrate, and an encapsulant encapsulating the stacked integrated circuit dies and the wire bonds. In an example, the integrated circuit dies of the packages 180 are memory dies, such as dynamic random access memory (DRAM) dies. The packages 180 are electrically and mechanically coupled to the back side redistribution structure 110 by external electrical connectors 182 attached to the metallization pattern 106 through openings through the dielectric layer 104. In some embodiments, the external electrical connectors 182 can include low-temperature reflowable material, such as solder, such as a lead-free solder, and in additional embodiments, the external electrical connectors 182 can include metal pillars. In some embodiments, the external electrical connectors 182 are controlled collapse chip connection (C4) bumps, microbumps, or the like. In some embodiments, the external electrical connectors 182 can be reflowed to attach the packages 180 to the metallization patterns 106. The integrated circuit dies of the packages 180 are electrically and communicatively coupled to the integrated circuit dies 114 through, for example, the wire bonds and substrate in the packages 180, the external electrical connectors 182, the back side redistribution structure 110, through vias 112, and the front side redistribution structure 160.

Figure 33:
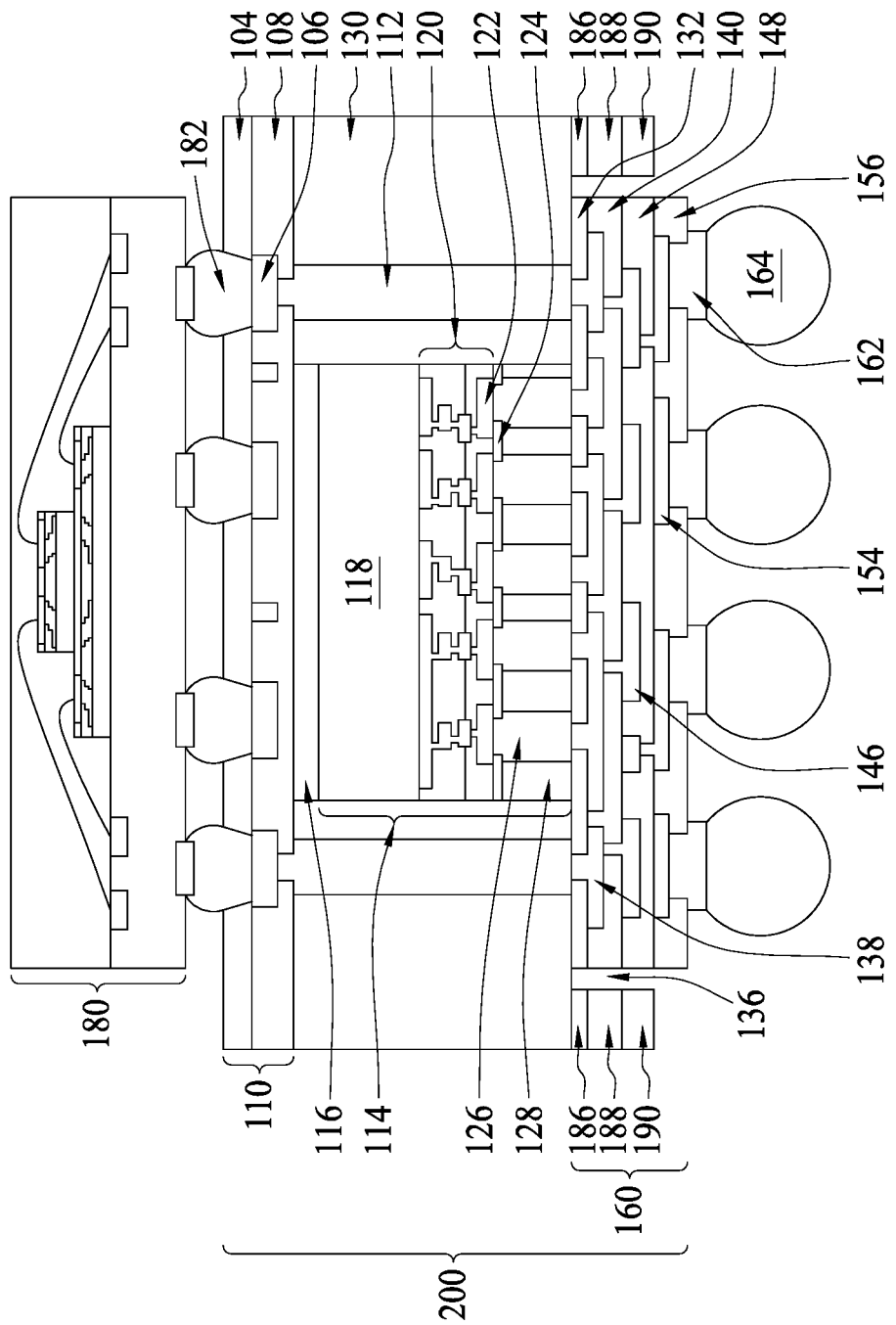

Further in FIG. 32, a singulation process is performed by sawing 184 along the scribe line regions 304. The sawing 184 singulates the first package region 300 from the second package region 302. FIG. 33 illustrates a resulting, singulated package-on-package (PoP) structure. The singulation results in package 200, which may be from one of the first package region 300 or the second package region 302, being singulated. As illustrated, the package 180 is attached to the back side redistribution structure 110 of the package 200. The package 200 has remaining dummy portions 186, 188, and 190 corresponding to dummy blocks 134, 144, and 152, respectively, along remaining regions of scribe line regions, e.g., scribe line region 304. The separation regions 136 can prevent the saw from contacting the dielectric layers 132, 140, 148, and 156 in the package region, e.g., first package region 300 or second package region 302, during the sawing 184, which can help reduce saw-induced delamination of the dielectric layers 132, 140, 148, and 156.

Figure 34:
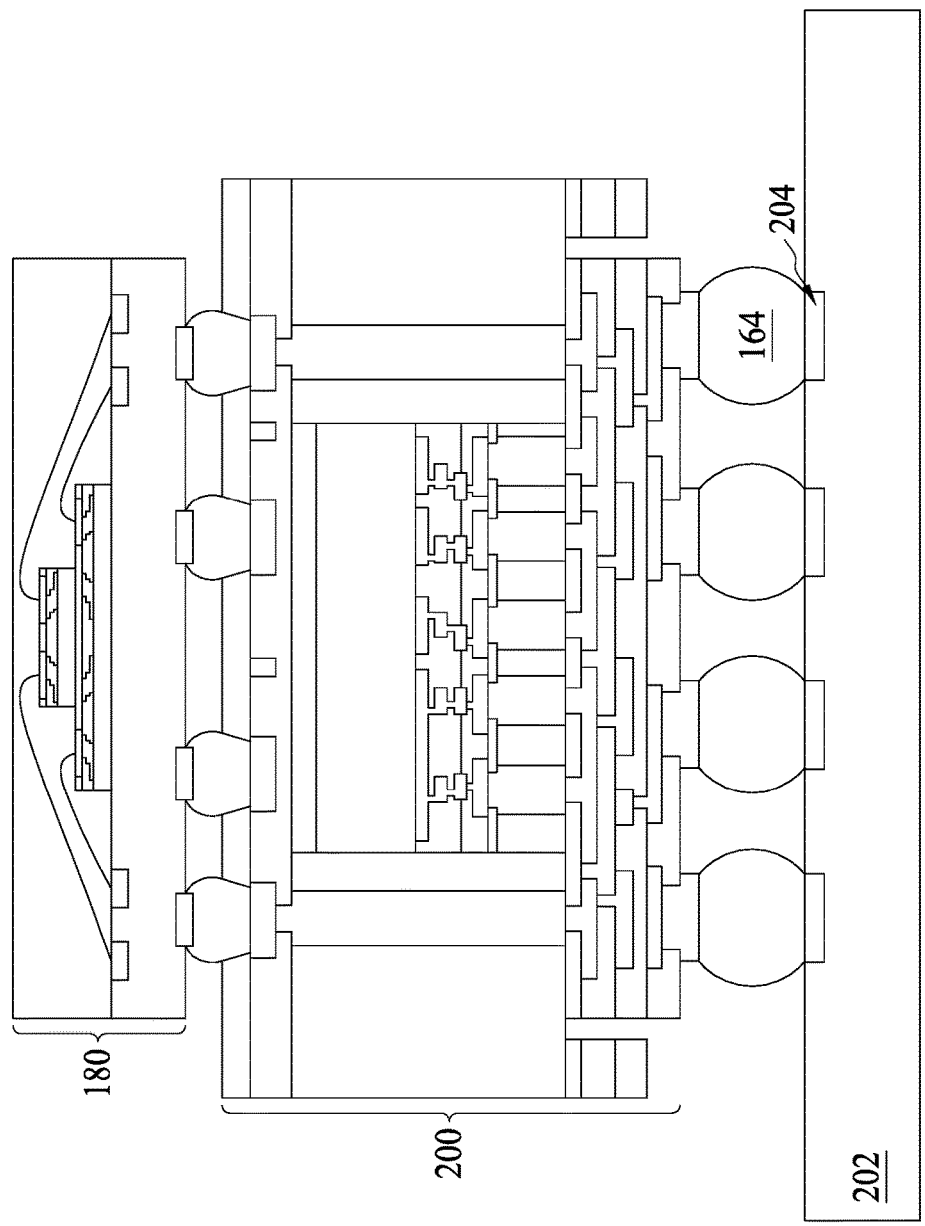

In FIG. 34, the PoP structure is attached to a substrate 202. The external electrical connectors 164 are electrically and mechanically coupled to pads 204 on the substrate 202. The substrate 202 can be, for example, a printed circuit board (PCB) or the like.

In an embodiment, a structure includes: an integrated circuit die; an encapsulant at least laterally encapsulating the integrated circuit die; a first dielectric layer on a first side of the encapsulant and the integrated circuit die; a metallization pattern extending along and through the first dielectric layer, the metallization pattern being connected to the integrated circuit die; and a first dummy block portion on the first side of the encapsulant, the first dummy block portion being separated from the first dielectric layer by a separation region, a sidewall of the first dielectric layer and a sidewall of the first dummy block portion facing the separation region, a bottom of the separation region being level with a top surface of the encapsulant, a bottom surface of the first dummy block portion, and a bottom surface of the first dielectric layer.

In some embodiments of the structure, the first dielectric layer and the first dummy block portion include a same dielectric material, and the first dielectric layer and the first dummy block portion extend from the first side of the encapsulant by a same distance. In some embodiments, the structure further includes: a second dielectric layer on the metallization pattern; and a second dummy block portion on the first dummy block portion, the second dummy block portion being separated from the second dielectric layer by the separation region. In some embodiments of the structure, the second dummy block portion is co-extensive with the first dummy block portion in perpendicular directions within a plane parallel to an interface between the first dummy block portion and the second dummy block portion. In some embodiments of the structure, the second dummy block portion is co-extensive with the first dummy block portion in a first direction within a plane parallel to an interface between the first dummy block portion and the second dummy block portion, the second dummy block portion not being co-extensive with the first dummy block portion in a second direction within the plane, the second direction being perpendicular to the first direction. In some embodiments of the structure, the second dummy block portion is not co-extensive with the first dummy block portion in perpendicular directions within a plane parallel to an interface between the first dummy block portion and the second dummy block portion. In some embodiments of the structure, the second dummy block portion is one of a plurality of second dummy block portions on the first dummy block portion, the second dummy block portions being aligned in a first direction within a plane parallel to an interface between the first dummy block portion and the second dummy block portions, the first direction extending parallel to an edge of the integrated circuit die. In some embodiments of the structure, the second dummy block portion is one of a plurality of second dummy block portions on the first dummy block portion, the second dummy block portions being aligned in a first direction within a plane parallel to an interface between the first dummy block portion and the second dummy block portions, the first direction extending perpendicular to an edge of the integrated circuit die. In some embodiments of the structure, the first dummy block portion extends partially along an edge of the encapsulant. In some embodiments of the structure, the first dummy block portion extends continuously along a plurality of edges of the encapsulant. In some embodiments of the structure, the first dummy block portion is one of a plurality of first dummy block portions, each of the first dummy block portions extending partially along a same edge of the encapsulant. In some embodiments of the structure, the first dummy block portion is free from the metallization pattern.

In an embodiment, a structure includes: an integrated circuit die; an encapsulant at least laterally encapsulating the integrated circuit die, the encapsulant having a first width; a through via extending through the encapsulant; and a redistribution structure connected to the through via and the encapsulant, the redistribution structure including: a first dielectric layer contacting a first side of the encapsulant and the integrated circuit die, the first dielectric layer having a second width, the second width being less than the first width; and a first dummy block portion contacting the first side of the encapsulant, the first dummy block portion being separated from the first dielectric layer by a separation region, the separation region being free from material of the first dielectric layer and material of the first dummy block portion, bottoms of the separation region, the first dummy block portion, and the first dielectric layer being planar with an interface between the first dummy block portion and the encapsulant.

In some embodiments of the structure, a combined width of the first dielectric layer, the first dummy block portion, and the separation region equals the first width of the encapsulant. In some embodiments of the structure, the first dielectric layer and the first dummy block portion include a same dielectric material, and the first dielectric layer and the first dummy block portion extend from the first side of the encapsulant by a same distance. In some embodiments, the structure further includes: a substrate; first external electrical connectors connecting the substrate to the redistribution structure; a package; and second external electrical connectors connecting the package to the through via.

In an embodiment, a structure includes: a package region including: a die, an encapsulant at least laterally encapsulating the die, and a redistribution structure on a first side of the encapsulant and the die, the redistribution structure including a first dielectric layer, a second dielectric layer, and a metallization pattern between the first dielectric layer and the second dielectric layer, the metallization pattern being connected to the die; and a periphery region along an edge of the package region, the periphery region including a first dummy block portion on the first side of the encapsulant, the first dummy block portion being separated from the first dielectric layer and the second dielectric layer by an opening, where the first side of the encapsulant is a planar surface extending continuously across the package region and the periphery region.

In some embodiments of the structure, the periphery region further includes a second dummy block portion on the first dummy block portion, the first dummy block portion corresponding to the first dielectric layer relative to the encapsulant, the second dummy block portion corresponding to the second dielectric layer relative to the encapsulant. In some embodiments of the structure, the opening has a width in a range from 50 µm to 100 µm In some embodiments, the structure further includes a substrate attached to the redistribution structure by external electrical connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A structure comprising:
an integrated circuit die;

an encapsulant at least laterally encapsulating the integrated circuit die;
a first dielectric layer on a first side of the encapsulant and the integrated circuit die;
a metallization pattern extending along and through the first dielectric layer, the metallization pattern being connected to the integrated circuit die; and
a first dummy block portion on the first side of the encapsulant, the first dummy block portion being separated from the first dielectric layer by a separation region, a sidewall of the first dielectric layer and a sidewall of the first dummy block portion facing the separation region, a bottom of the separation region being level with a top surface of the encapsulant, a bottom surface of the first dummy block portion, and a bottom surface of the first dielectric layer.

2. The structure of claim 1, wherein the first dielectric layer and the first dummy block portion comprise a same dielectric material, and the first dielectric layer and the first dummy block portion extend from the first side of the encapsulant by a same distance.

3. The structure of claim 1 further comprising:
a second dielectric layer on the metallization pattern; and
a second dummy block portion on the first dummy block portion, the second dummy block portion being separated from the second dielectric layer by the separation region.

4. The structure of claim 3, wherein the second dummy block portion is co-extensive with the first dummy block portion in perpendicular directions within a plane parallel to an interface between the first dummy block portion and the second dummy block portion.

5. The structure of claim 3, wherein the second dummy block portion is co-extensive with the first dummy block portion in a first direction within a plane parallel to an interface between the first dummy block portion and the second dummy block portion, the second dummy block portion not being co-extensive with the first dummy block portion in a second direction within the plane, the second direction being perpendicular to the first direction.

6. The structure of claim 3, wherein the second dummy block portion is not co-extensive with the first dummy block portion in perpendicular directions within a plane parallel to an interface between the first dummy block portion and the second dummy block portion.

7. The structure of claim 3, wherein the second dummy block portion is one of a plurality of second dummy block portions on the first dummy block portion, the second dummy block portions being aligned in a first direction within a plane parallel to an interface between the first dummy block portion and the second dummy block portions, the first direction extending parallel to an edge of the integrated circuit die.

8. The structure of claim 3, wherein the second dummy block portion is one of a plurality of second dummy block portions on the first dummy block portion, the second dummy block portions being aligned in a first direction within a plane parallel to an interface between the first dummy block portion and the second dummy block portions, the first direction extending perpendicular to an edge of the integrated circuit die.

9. The structure of claim 1, wherein the first dummy block portion extends partially along an edge of the encapsulant.

10. The structure of claim 1, wherein the first dummy block portion extends continuously along a plurality of edges of the encapsulant.

11. The structure of claim 1, wherein the first dummy block portion is one of a plurality of first dummy block portions, each of the first dummy block portions extending partially along a same edge of the encapsulant.

12. The structure of claim 1, wherein the first dummy block portion is free from the metallization pattern.

13. A structure comprising:
an integrated circuit die;
an encapsulant at least laterally encapsulating the integrated circuit die, the encapsulant having a first width;
a through via extending through the encapsulant; and
a redistribution structure connected to the through via and the encapsulant, the redistribution structure comprising:
a first dielectric layer contacting a first side of the encapsulant and the integrated circuit die, the first dielectric layer having a second width, the second width being less than the first width; and
a first dummy block portion contacting the first side of the encapsulant, the first dummy block portion being separated from the first dielectric layer by a separation region, the separation region being free from material of the first dielectric layer and material of the first dummy block portion, bottoms of the separation region, the first dummy block portion, and the first dielectric layer being planar with an interface between the first dummy block portion and the encapsulant.

14. The structure of claim 13, wherein a combined width of the first dielectric layer, the first dummy block portion, and the separation region equals the first width of the encapsulant.

15. The structure of claim 13, wherein the first dielectric layer and the first dummy block portion comprise a same dielectric material, and the first dielectric layer and the first dummy block portion extend from the first side of the encapsulant by a same distance.

16. The structure of claim 13 further comprising:
a substrate;
first external electrical connectors connecting the substrate to the redistribution structure;
a package; and
second external electrical connectors connecting the package to the through via.

17. A structure comprising:
a package region comprising:
a die,
an encapsulant at least laterally encapsulating the die, and
a redistribution structure on a first side of the encapsulant and the die, the redistribution structure comprising a first dielectric layer, a second dielectric layer, and a metallization pattern between the first dielectric layer and the second dielectric layer, the metallization pattern being connected to the die; and
a periphery region along an edge of the package region, the periphery region comprising a first dummy block portion on the first side of the encapsulant, the first dummy block portion being separated from the first dielectric layer and the second dielectric layer by an opening,
wherein the first side of the encapsulant is a planar surface extending continuously across the package region and the periphery region.

18. The structure of claim 17, wherein the periphery region further comprises a second dummy block portion on the first dummy block portion, the first dummy block portion corresponding to the first dielectric layer relative to the encapsulant, the second dummy block portion corresponding to the second dielectric layer relative to the encapsulant.

19. The structure of claim 17, wherein the opening has a width in a range from 50 μm to 100 μm.

20. The structure of claim 17 further comprising a substrate attached to the redistribution structure by external electrical connectors.

* * * * *